(12) United States Patent
Kurkovskiy

(10) Patent No.: US 8,154,278 B2
(45) Date of Patent: Apr. 10, 2012

(54) METAL FACE INDUCTIVE PROXIMITY SENSOR

(75) Inventor: Igor Kurkovskiy, Twinsburg, OH (US)

(73) Assignee: Pepperl+Fuchs, Inc., Twinsburg, OH (US)

( * ) Notice: Subject to any disclaimer, the term of this patent is extended or adjusted under 35 U.S.C. 154(b) by 644 days.

(21) Appl. No.: 12/270,992

(22) Filed: Nov. 14, 2008

(65) Prior Publication Data

US 2009/0189600 A1 Jul. 30, 2009

Related U.S. Application Data

(60) Provisional application No. 61/023,834, filed on Jan. 26, 2008.

(51) Int. Cl.
*G01N 27/72* (2006.01)

(52) U.S. Cl. .................. 324/234; 324/207.12

(58) Field of Classification Search ............. 324/207.26, 324/236, 207.12, 234, 164, 207.15
See application file for complete search history.

(56) References Cited

U.S. PATENT DOCUMENTS

| | | |
|---|---|---|
| 5,065,093 A | 11/1991 | Nauta et al. |
| 6,130,489 A | 10/2000 | Heimlicher |
| 6,133,654 A | 10/2000 | Heimlicher |
| 6,215,365 B1 | 4/2001 | Kurkovskiy |
| 6,236,200 B1 * | 5/2001 | Nekado et al. ........... 324/207.26 |
| 6,429,786 B1 | 8/2002 | Bansemir et al. |
| 6,507,189 B2 | 1/2003 | Woolsey et al. |
| 7,173,411 B1 * | 2/2007 | Pond ....................... 324/207.12 |
| 7,245,121 B2 | 7/2007 | Freund et al. |
| 7,262,595 B2 * | 8/2007 | Rudd, III ................. 324/207.26 |
| 2007/0001663 A1 * | 1/2007 | Hrubes ......................... 324/164 |
| 2009/0085560 A1 * | 4/2009 | Rollins et al. ............ 324/207.26 |

OTHER PUBLICATIONS

NDT Resource Center Website, 'Depth of Penetration of Radiation Energy', dated Mar. 5, 2007.*

* cited by examiner

*Primary Examiner* — Huy Q Phan
*Assistant Examiner* — Temilade S Rhodes-Vivour
(74) *Attorney, Agent, or Firm* — Fay Sharpe LLP

(57) ABSTRACT

Metal face inductive proximity sensors and methods are presented for sensing the presence or absence of a target object in a target sensing area in which a coil system is operated to generate a magnetic field extending outward from the sensing face at a frequency in a range that maximizes a relative target effect for the sensing face area, material, and thickness, and a target material from which the target object is made to allow the protective advantages of metal sensing face materials while enhancing sensing distance by optimizing the ratio of the target energy loss to the energy loss in the metal face.

20 Claims, 23 Drawing Sheets

8mm, Al target
9*9mm at 3mm
0.2mm face thickness

8mm, Al target
9*9mm at 3mm
0.4mm face thickness

8mm, Al target
9*9mm at 3mm
0.6mm face thickness

8mm, St.Steel target
9*9mm at 2mm
0.2mm face thickness

8mm, St.Steel target
9*9mm at 2mm
0.4mm face thickness

8mm, St.Steel target
9*9mm at 2mm
0.6mm face thickness

8mm, Steel target
9*9mm at 3mm
0.2mm face thickness

8mm, Steel target
9*9mm at 3mm
0.4mm face thickness

8mm, Steel target
9*9mm at 3mm
0.6mm face thickness

12mm, Al target
15*15mm at 5mm
0.3mm face thickness

12mm, Al target
15*15mm at 5mm
0.5mm face thickness

12mm, Al target
15*15mm at 5mm
0.7mm face thickness

12mm, St.Steel target
15*15mm at 3.5mm
0.3mm face thickness

12mm, St.Steel target
15*15mm at 3.5mm
0.5mm face thickness

12mm, St.Steel target
15*15mm at 3.5mm
0.7mm face thickness

12mm, Steel target
15*15mm at 5mm
0.3mm face thickness

12mm, Steel target
15*15mm at 5mm
0.5mm face thickness

12mm, Steel target
15*15mm at 5mm
0.7mm face thickness

18mm, Al target
30*30mm at 10mm
0.3mm face thickness

18mm, Al target
30*30mm at 10mm
0.5mm face thickness

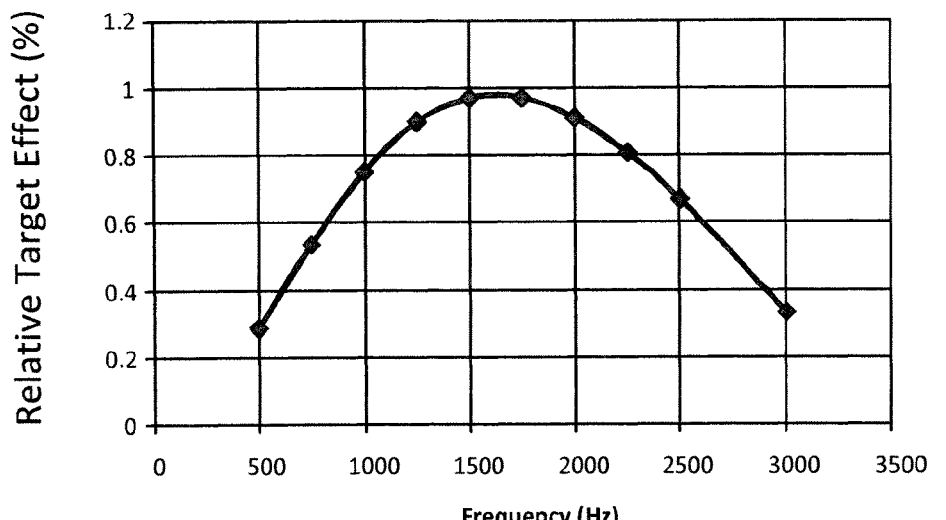
FIG. 7C  18mm, Al target
30*30mm at 10mm
0.7mm face thickness
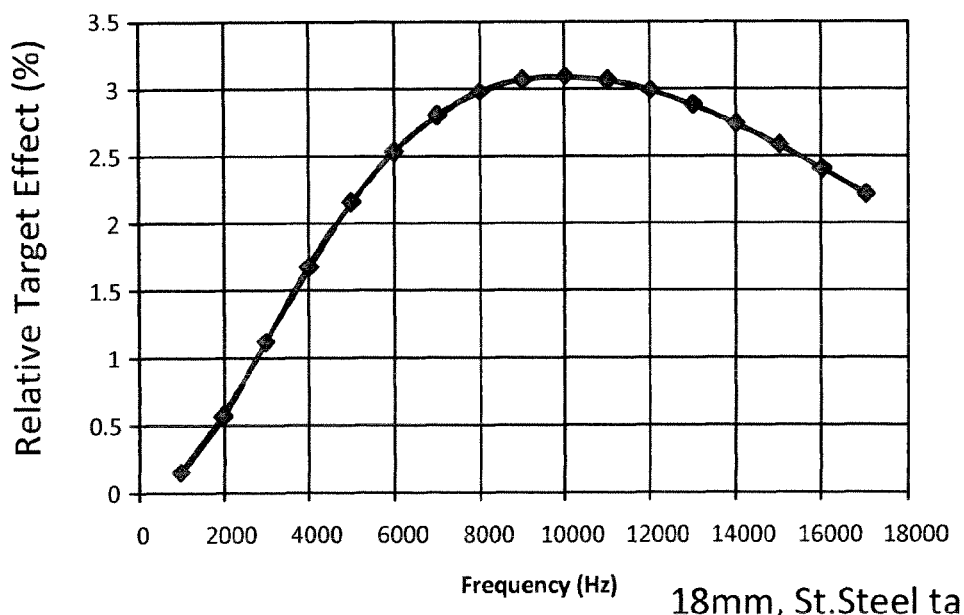
FIG. 7D  18mm, St.Steel target
30*30mm at 7mm
0.3mm face thickness

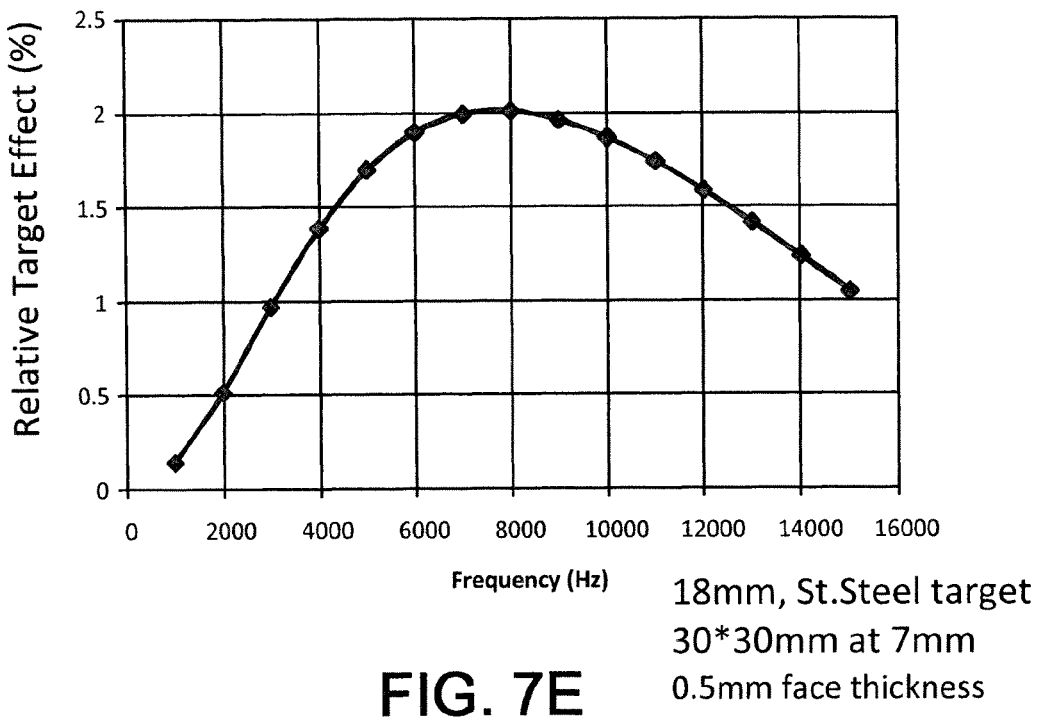
FIG. 7E  18mm, St.Steel target 30*30mm at 7mm 0.5mm face thickness
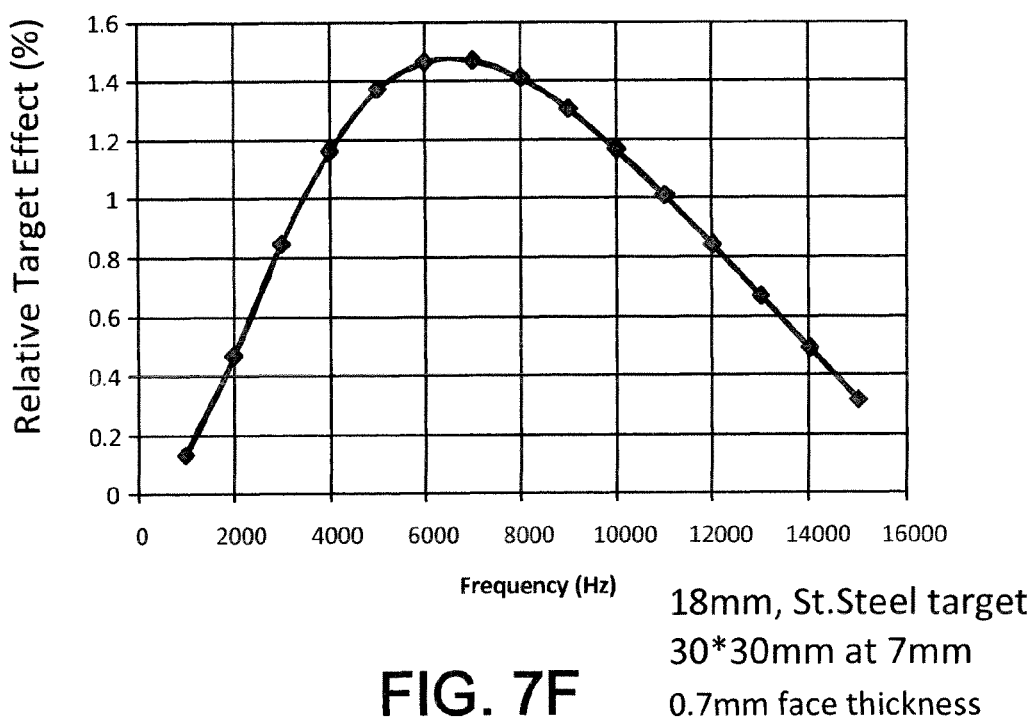
FIG. 7F  18mm, St.Steel target 30*30mm at 7mm 0.7mm face thickness

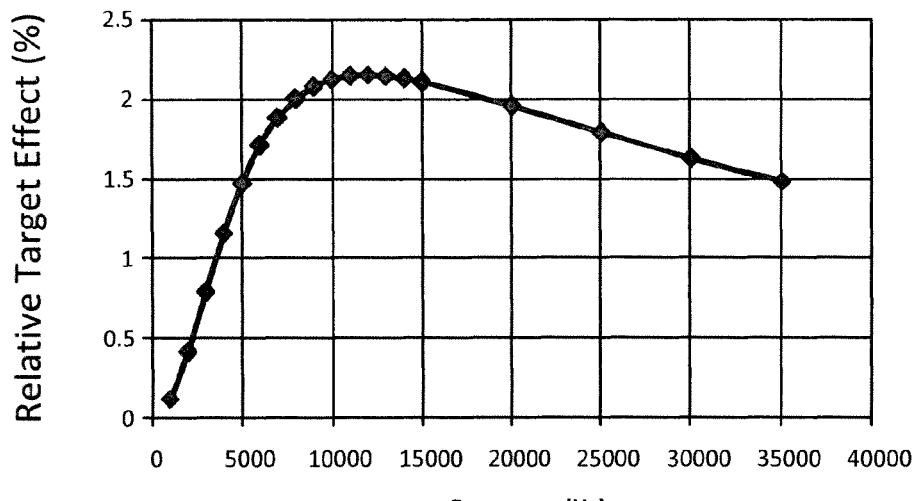
FIG. 7G  18mm, Steel target
30*30mm at 10mm
0.3mm face thickness
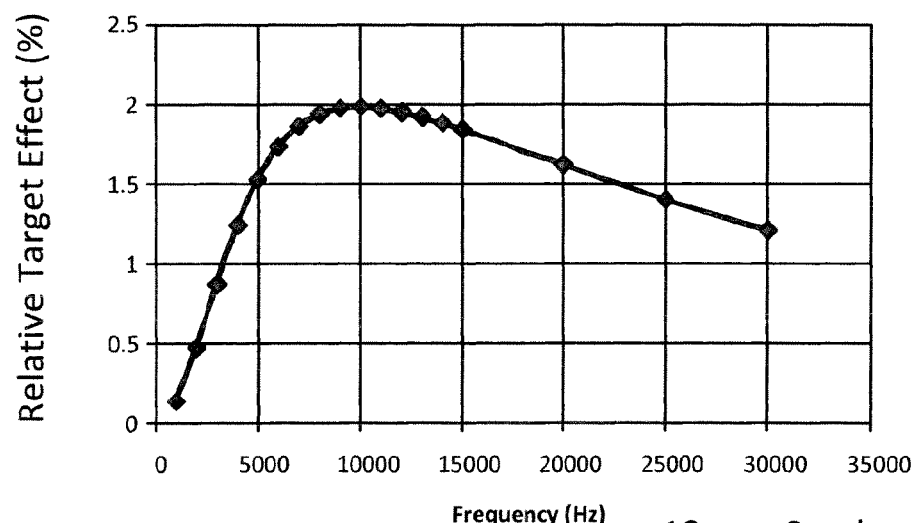
FIG. 7H  18mm, Steel target
30*30mm at 10mm
0.5mm face thickness 18mm, Steel target
30*30mm at 10mm
0.7mm face thickness

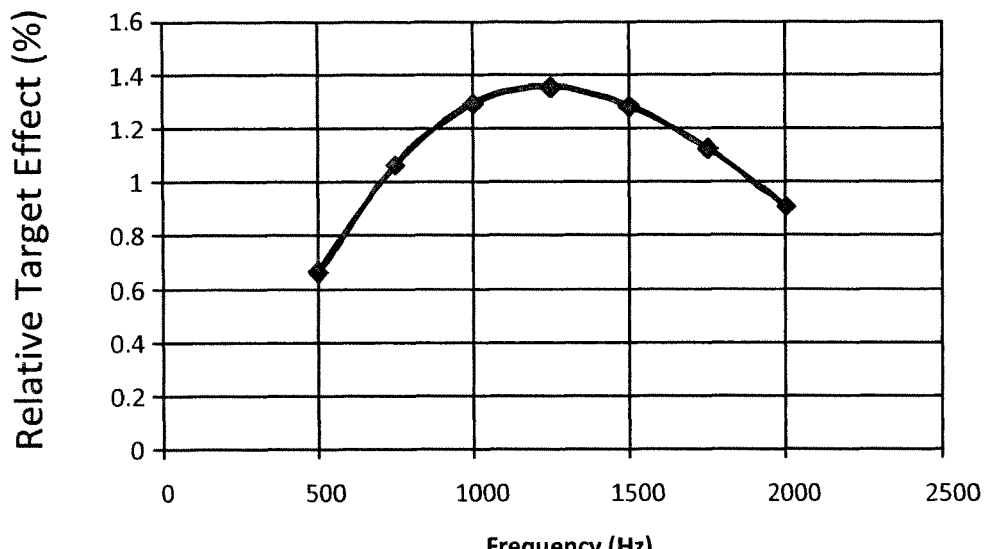
FIG. 8A  30mm, Al target 45*45mm at 15mm 0.3mm face thickness
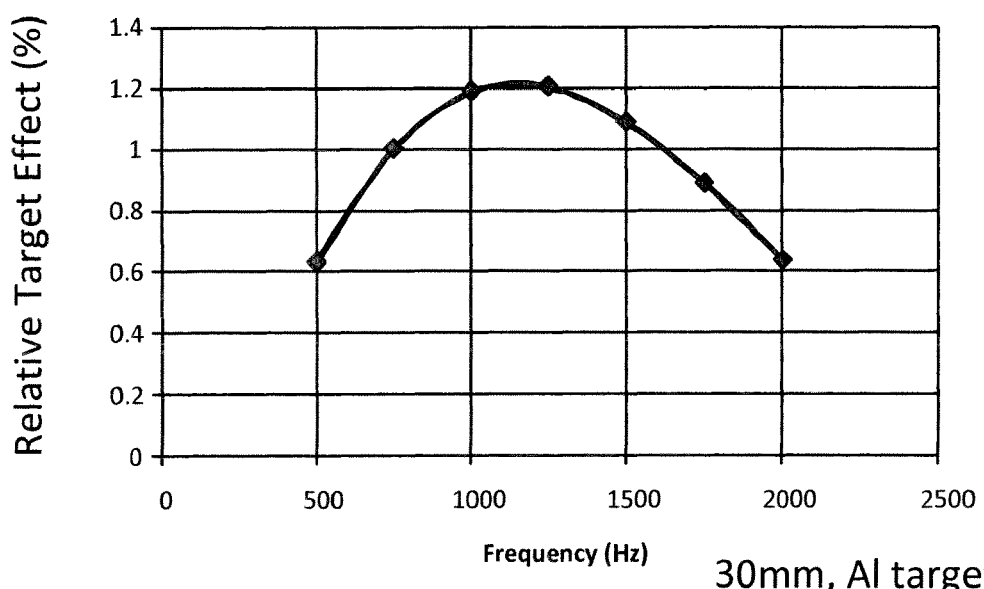
FIG. 8B  30mm, Al target 45*45mm at 15mm 0.5mm face thickness 30mm, Al target
45*45mm at 15mm
0.7mm face thickness 30mm, St.Steel target
45*45mm at 10mm
0.3mm face thickness

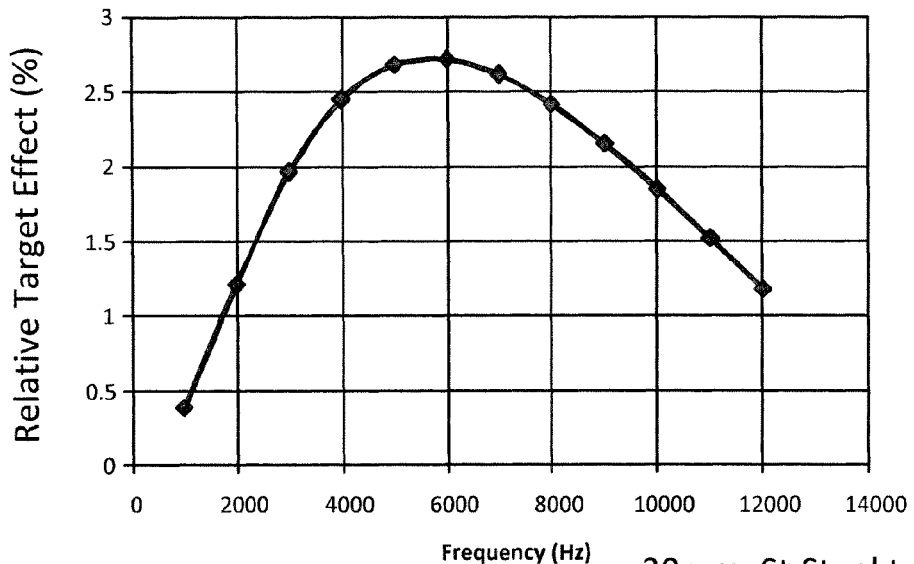
FIG. 8E  30mm, St.Steel target 45*45mm at 10mm 0.5mm face thickness
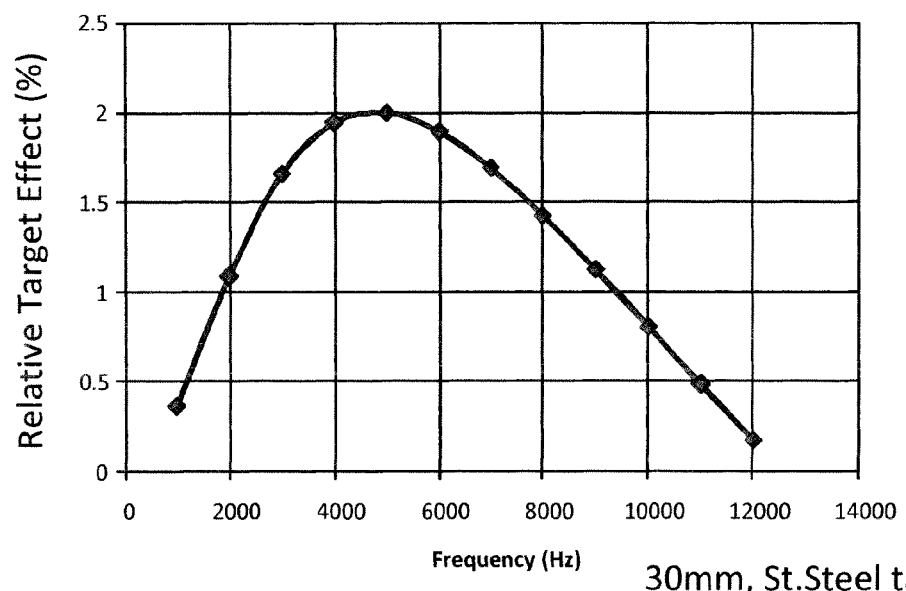
FIG. 8F  30mm, St.Steel target 45*45mm at 10mm 0.7mm face thickness 30mm, Steel target
45*45mm at 15mm
0.3mm face thickness 30mm, Steel target
45*45mm at 15mm
0.5mm face thickness 30mm, Steel target
45*45mm at 15mm
0.7mm face thickness

METAL FACE INDUCTIVE PROXIMITY SENSOR

REFERENCE TO RELATED APPLICATION

This application claims priority to and the benefit of U.S. Provisional Patent Application Ser. No. 61/023,834, which was filed Jan. 26, 2008, entitled METAL FACE INDUCTIVE PROXIMITY SENSOR, the entirety of which is hereby incorporated by reference.

FIELD OF THE INVENTION

The present disclosure relates generally to inductive sensors and more particularly to metal-face inductive proximity sensors for use in sensing the presence or absence of a target object in a target sensing area.

BACKGROUND OF THE INVENTION

Inductive proximity sensors are noncontact devices that sense the presence of target objects. Changes in the coil system impedance are caused by disturbances in the generated magnetic field that are due to the presence of a conductive and/or magnetic target object in a sensing area. The coil system impedance changes are sensed and an output signal is generated according to the sensed impedance to indicate the presence or absence of a target object in the sensing area. The coil is located in a housing with a sensing face from which the magnetic field extends. The housing is typically a cylindrical barrel shape, a rectangular structure, a slot, or a ring. Cylindrical sensors are often threaded to allow flush or non-flush mounting to a structure with a threaded hole, with the sensing face at one end of the barrel being carefully spaced from the path along which the target object travels. Slot style sensors detect the presence of a target as it passes through a sensing slot, typically in the form of a "U"-shaped channel. Ring shaped sensors sense objects passing through the center of the ring body. The coil system may be fashioned in a variety of arrangements, including single coil types with an excitation generator, where the proximity of a conducting/magnetic target changes the coil inductance. Dual coil arrangements are possible with two coils constituting a differential transformer with an excitation generator, where the presence of the target changes the coupling level and inductance of the coils. Tank circuit type inductive sensors include a single coil and a capacitor arranged as resonant tank circuit, wherein the presence of a target changes the coil inductance and the impedance of resonant tank. Other forms of inductive sensors may combine two or more of these circuit topologies.

In metal face sensors, the sensor circuitry including the coil system is enclosed within a housing made from stainless steel or other corrosion-resistant materials to avoid exposure to dirt, dust, humidity, etc. so as to mitigate sensor degradation. The sensing face, moreover, is susceptible to unintended impact by moving target objects being sensed. Metal-face inductive proximity sensors include a metal face structure between the coil system and the external sensing area to protect the coil and associated ferrite core from the external conditions including contaminants and impact damage, where the face and the rest of the housing structure may form a single integrated enclosure. However, since the sensing field generated by the coil system passes through the sensing face, conventional metal face inductive proximity sensors suffer from reduced sensing distances due to depletion of the sensing field before it reaches the external sensing area. Plastic faced inductive proximity sensors have been introduced, in which the sensing face is made of plastic to mitigate field depletion. These sensor face designs, however, do not provide as much protection for the coil system from extreme ambient conditions and impacts. Thus, there remains a need for improved metal face inductive proximity sensors by which the protection advantages of the metal sensing face can be achieved while mitigating the adverse sensing distance limitations associated with conventional metal face designs.

SUMMARY OF INVENTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Instead, the primary purpose of this summary is to present some concepts of the disclosure in a simplified form prior to the more detailed description that is presented hereinafter.

The disclosure relates to metal face inductive proximity sensors in which the operating frequency is such that the relative target effect is optimized for the sensing face area, material, and thickness, and target material. For a given metal face structure, including material, thickness, and area, and a given target material type, there is a relationship between the sensor coil system frequency and the effective sensing distance which can be characterized in terms of the target and sensing face losses. Contrary to conventional sensor design thinking, moreover, the inventor has appreciated that the sensing capabilities of metal face sensors can be significantly improved by operation in a certain frequency range tailored according to the sensing face area, face material, face thickness, and target material. In this regard, a relative target effect can be ascertained for a given set of these design parameters and plotted as a function of frequency. The inventor has further appreciated that, contrary to conventional design approaches for inductive proximity sensors, such a curve will include a global maxima and/or multiple local maximas, such that operation in the frequency range that includes a value that maximizes a relative target effect will optimize or significantly improve the sensing distance. The present disclosure thus facilitates the provision of inductive proximity sensors with the protection of conventional metal sensing face materials while enhancing sensing distance by reducing the amount of field and energy loss in the metal face and increasing target loss, in which the resulting ratio of target loss to face loss is maximized or increased over conventional designs. The sensor can be of any suitable form and circuit topology, such as round or rectangular devices, slot sensors, or ring sensors that employ single or multiple coils with excitation generators or resonant tank circuits to generate an alternating magnetic field extending outward from the metal sensing face in a target sensing area.

In accordance with one or more aspects of the disclosure, an inductive proximity sensor is provided that includes a housing with a metallic sensing face of a given thickness and material, as well as a coil system and a sensing system. The coil is provided with alternating current to generate an alternating magnetic field extending outward from the sensing face in the target sensing area at a frequency in a frequency range that includes a value that maximizes a relative target effect for the sensing face area, material, and thickness, and a target material from which the target object is made. The sensing system operates to sense the coil system impedance and provides a signal to indicate the presence or absence of objects in the target sensing area based at least partially on the sensed impedance. In certain disclosed embodiments for stainless steel target material with a 0.3 to 1.0 mm thick stainless steel circular sensing face of about 30 mm diameter, the coil is energized at a frequency value in a range for which the relative target effect is within about 20 percent of the global or relative maximum.

Further aspects of the disclosure provide a method for sensing the presence or absence of a target object in a target sensing area. The method includes providing an inductive proximity sensor including a body with a housing and a sensing face formed of a metallic material of a given thickness extending across a sensing surface facing the target sensing area, and a coil. Alternating current is provided to the coil to generate an alternating magnetic field extending outward from the sensing face in the target sensing area at a frequency in a frequency range that includes a frequency value that maximizes a relative target effect for the sensing face area, material, and thickness, and a target material. The method further includes sensing an impedance of the coil, and providing a signal indicative of the presence or absence of objects in the target sensing area based at least partially on the sensed impedance.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings, in which.

DETAILED DESCRIPTION OF THE INVENTION

Figure 1:
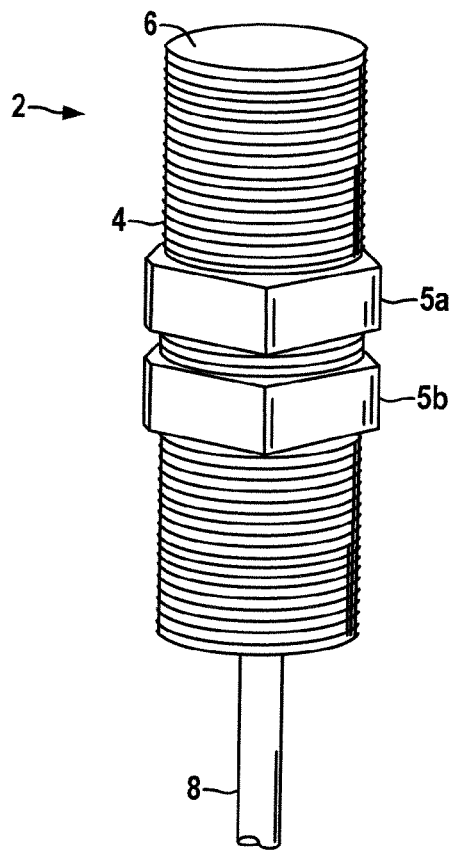
FIG. 1 is a perspective view illustrating an exemplary flush mount metal face inductive proximity sensor in accordance with one or more aspects of the present disclosure.

Referring now to the figures, several embodiments or implementations of the present disclosure are hereinafter described in conjunction with the drawings, wherein like reference numerals are used to refer to like elements throughout, and wherein the various features and plots are not necessarily drawn to scale. The disclosure relates to inductive proximity sensors and methods for sensing the presence or absence of a target object in a target sensing area. While illustrated and described hereinafter in the context of an exemplary barrel-shaped single-coil sensor 2 employing a resonant tank circuit, the various concepts and aspects of the disclosure are applicable to other forms and inductive sensor circuit configurations including without limitation round or rectangular face devices, slot sensors, or ring sensors that employ single or multiple coils with excitation generators and/or resonant tank circuits to generate an alternating magnetic field extending outward from the metal sensing face in a target sensing area, wherein all such alternative implementations are contemplated as falling within the scope of the present disclosure and the appended claims.

Figure 2:
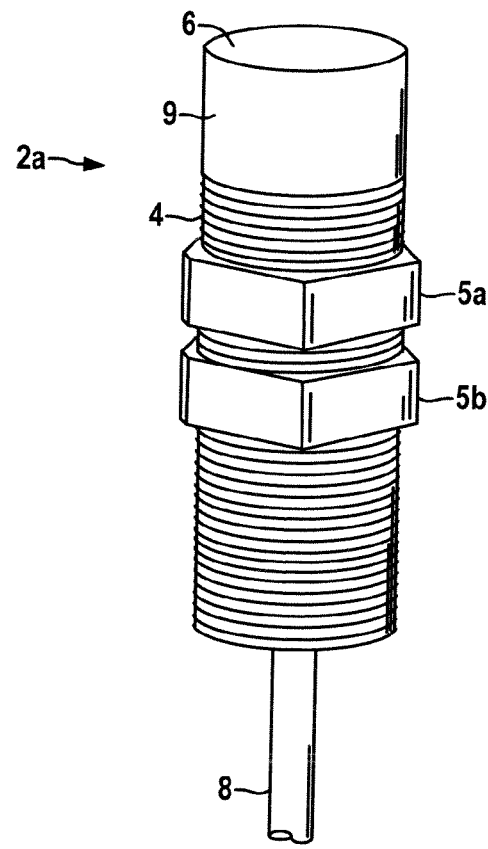
FIG. 2 is a perspective view illustrating an exemplary non-flush mount metal face inductive proximity sensor in accordance with the present disclosure.

Referring initially to FIGS. 1 and 2, an exemplary inductive proximity sensor 2 is illustrated in FIG. 1, including an elongated cylindrical (barrel-shaped) body with a housing 4 having external threads extending to an upper sensing face surface 6. The sensor 2 of FIG. 1 is a flush mount sensor where the extension of the external threads to the sensing face 6 allows mounting of the sensor 2 in a threaded hole with the sensing face 6 flush or near flush with a surface in which the threaded hole is formed. FIG. 2 depicts a non-flush mount barrel-shaped sensor 2a having a flat outer sidewall surface 9 at the top end of the housing 4 between the end of the external threads. The barrel-type proximity sensors 2, 2a in FIGS. 1 and 2 can be mounted to a threaded hole and secured using one or two nuts 5a, 5b, and include output signal wiring such as a cable 8 for conveying an output signal and for receiving power from an external source. The output of the sensor 2, may be an analog signal, a switch state, a digital signal, or combinations thereof.

Figure 3:
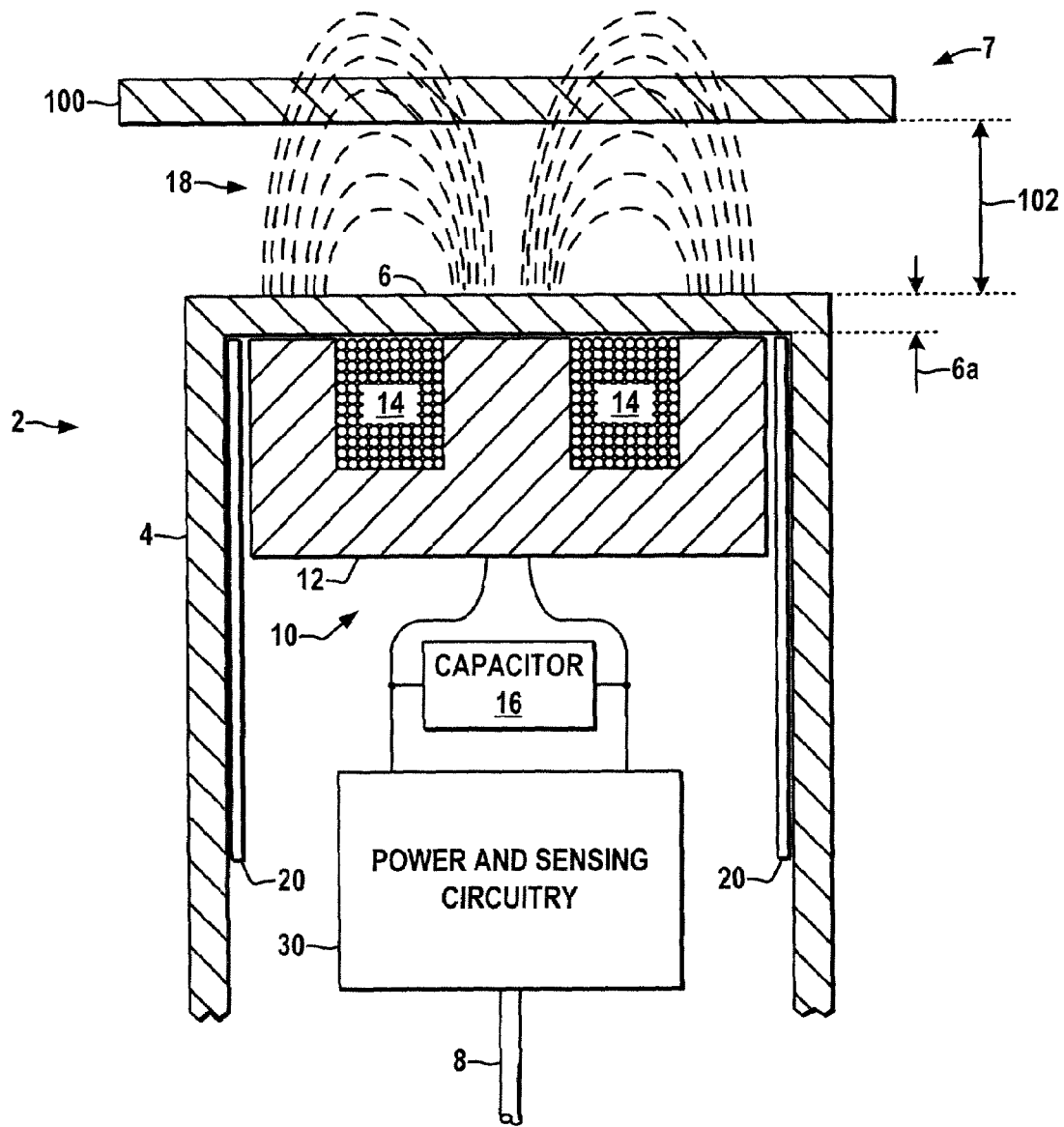
FIG. 3 is a simplified partial schematic side elevation view in section illustrating an exemplary implementation of the metal face inductive proximity sensors of FIGS. 1 and 2 including a coil system and a capacitance forming a tank circuit in accordance with the present disclosure.
Figure 4:
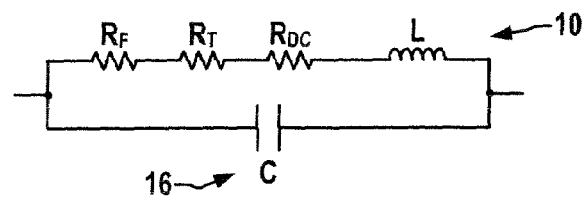
FIG. 4 is a simplified schematic diagram illustrating the tank circuit in the proximity sensor of FIG. 3.

Referring also to FIGS. 3 and 4, FIG. 3 shows an exemplary implementation of the metal face inductive proximity sensors 2, 2a of FIGS. 1 and 2 for sensing the presence or absence of a target object 100 in a target sensing area 7 proximate the sensing face 6. The sensing face 6 extends across a sensing surface facing the target sensing area 7 and is formed of a metallic material of a given thickness 6a. In one embodiment, the metal sensing face 6 is formed of a stainless steel metallic material having a thickness 6a of about 0.3 to 1.0 mm, although other metal face thicknesses and materials can be used. As used herein, the term about with respect to diameter or thickness dimensions includes the stated values and values within 5 to tem percent of the stated values. In the illustrated implementation, moreover, the metal face 6 and the rest of the housing structure 4 form a single integrated enclosure, although not a strict requirement of the present disclosure. The sensor 2 also includes a coil system 10 with a coil 14 wound in a recess of a ferrite core 12. The coil 14 is provided with alternating current to generate an alternating magnetic field 18 extending outward from the sensing face 6 in the target sensing area 7, as well as a capacitor 16.

As shown in FIG. 4, the capacitor 16 and the coil inductance 14 of the coil system 10 are interconnected in parallel so as to form a resonant tank circuit tuned for operation at a given frequency value for generating the magnetic field 18. The schematic circuit representation of FIG. 4 also shows representative resistive elements including a DC resistance $R_{DC}$, a target resistance element $R_T$, and a face resistive element $R_F$, as described further hereinafter. The sensor 2 additionally includes power and sensing circuitry 30 (FIG. 3) that powers the coil system 10 and senses an impedance of the coil 14. The circuitry 30 provides a signal via the output cable 8 that indicates the presence or absence of objects 100 in the target sensing area 7 based at least partially on the sensed coil system impedance. The exemplary sensor 2, moreover, includes a shield 20 in the form of a metal band extending laterally around the core 12 for mitigating lateral extension of the magnetic field 18 so as to direct the field 18 to the front sensing face 6 and into the target sensing area 7.

In accordance with the present disclosure, the coil 14 is operated by provision of AC current at a frequency in a frequency range that includes a frequency value that maximizes a relative target effect for the sensing face area, material, and thickness 6a, and a target material from which the target object 100 is made. In the illustrated barrel-shaped sensor 2, the target area is circular having a diameter of about 30 mm, although other sensing face sizes and shapes may be used, including without limitation circular faces of about 8, 12, or 18 mm diameters, rectangular sensing faces, multi-face structures such as "U"-shaped channel or slot sensors, ring sensors with sensing faces extending wholly or partially around an inner portion of a ring, etc. In addition, the illustrated sensing face is about 0.3 to 1.0 mm thick stainless steel, although other metals and thicknesses 6a can be used. In the described embodiments, moreover, the sensor 2 is adapted by careful selection of the face thickness 6a and operating frequency for sensing target object structures 100 made from stainless steel, steel, and aluminum, although the sensor 2 can be used for sensing other magnetic or non-magnetic target materials.

As the illustrated sensor 2 employs a tank circuit formed by the coil inductance 14 and the capacitance 16, the operating frequency f can be set by choosing a capacitor 16 and adjusting the number of winding turns of the coil system 10, where the resonant operating frequency $f_{RES}$ is determined according to the following equation (1):

$$f_{RES} = 1/2\pi(LC)^{1/2}, \qquad (1)$$

where L is the coil inductance and C is the capacitance of the capacitor 16.

In the illustrated sensor 2, the sensing system 30 detects the presence or absence of a target object 100 in the sensing area 7 by sensing changes in the impedance of the resonant tank circuit while the coil 14 is provided with alternating current at the set frequency value f. The sensing system 30 can include any suitable circuitry, whether hardware, software, firmware, or combinations thereof to detect coil system impedance changes. Other possible embodiments may include multiple coils with the presence or absence of the target 100 being sensed at least partially by changing coupling between coils, where the sensing system 30 can include any suitable hardware, software, firmware, or combinations thereof to detect such coupling changes.

As mentioned above, the use of metal material for the sensing face 6 provides certain advantages with respect to physical protection of the coil system 10 against dirt, dust, impacts with target objects 100, etc., where such protection is advantageously provided in a cost effective manner by making a single piece housing 4 with integral metal sensing face 6. However, metal face sensors previously suffered from limited sensing distance range 102, because the metal face 6 attenuates the alternating magnetic field 18. This sensing face magnetic field attenuation may be evaluated according to the following equation (2):

$$\delta = 1/(\pi f \mu \sigma)^{1/2}, \qquad (2)$$

where $\delta$ is the depth of penetration in meters, f is the magnetic field frequency in Hertz (Hz), $\mu$ is the magnetic permeability (H/m), and $\sigma$ is the electrical conductivity in Siemens per meter for the sensing face material.

With respect to the design of the metal face 6 in the inductive proximity sensor 2, it is noted from equation (2) that a metal face material with low electrical conductivity ($\sigma$) and low magnetic permeability ($\mu$) will increase the penetration depth, and will thereby reduce the amount of losses in the metal face 6. In this respect, stainless steel 303, 304, 316, etc. provides a suitable metal face material as in the illustrated examples. Furthermore, equation (2) shows that the sensing face penetration depth increases as frequency decreases. It is noted in this regard that conventional sensor design approaches that focused only on the face 6 tended to make the operating frequency as low as possible in order to increase the field penetration and hopefully improve the sensing distance 102.

However, as shown in equation (1), a low resonant frequency in the tank circuit is typically achieved by using a coil 14 with large inductance L, such as by using a large number of winding turns in the coil system 10. This increased inductance, however, leads to an increase in the DC coil resistance ($R_{DC}$ in FIG. 4). This increased DC resistance $R_{DC}$ affects the tank circuit quality factor Q which can be describe by following equation (3):

$$Q = 2\pi f L / R_{DC}. \qquad (3)$$

Thus, reducing the operating frequency f by increasing the number of turns in the coil 14, while previously thought to improve the penetration depth per se with respect to the face 6, can lead to poor tank circuit quality factor Q, resulting in low sensor sensitivity and, because of the increased DC resistance $R_{DC}$, greater sensitivity drift with respect to temperature.

In accordance with the present disclosure, the inventor has appreciated that tailoring the metal face thickness 6a and the operating frequency f can provide for optimized or improved sensing distance 102 while allowing the protective advantages of metal sensing face materials to be achieved compared with conventional metal faced sensor designs. In this respect, it is seen that the previous understanding of the effects of frequency on inductive sensor designs focused primarily on the face material. The inventor has appreciated that there exists a relationship among the sensing face material, thickness, and area, and the target object material that allows an optimization of relative target effect by careful frequency selection, due to a unique relationship between the operating frequency f and a relative target effect characterized in terms of the coil system impedances attributable to the target 100 and the metal sensing face 6.

In particular, as illustrated and described further below, the inventor has appreciated that the relative target effect as a function of frequency yields a curve having one or more local maxima values, at or around which the system will provide for optimized sensing distance. Thus, contrary to conventional wisdom, the sensor performance is not simply improved by maximizing or minimizing operating frequency f. Rather, the present disclosure recognizes that careful selection of the frequency f to a frequency in a range that includes a frequency value at which a relative target effect is maximized for the sensing face area, material, and thickness, and a target material from which the target object 100 is made will yield at or near the best possible sensing distance 102 for a given set of these parameters. In this regard, the coil is preferably energized at a frequency value in a range for which the relative target effect is within about 20 percent of the global or relative maximum to achieve increased sensing distance 102.

In order to further understand this novel concept, it is noted that in operation of the sensor 2, the coil 14 is provided with alternating current and accordingly generates an alternating magnetic field 18 around the coil 14 and in the target sensing area 7, as shown in FIG. 3. This alternating magnetic field 18, in turn, induces eddy-currents in any surrounding conductive materials of the coil 14, the face 6, the target 100, the housing 4, etc. In particular, the sensing face 6 is in close proximity to the area with the greatest flux density, and thus is subjected to the greatest amount of induced eddy-currents. Due to penetration depth behavior, the eddy-currents are mostly concentrated at the inner surface of the metal face 6, and become less and less toward the outer surface of the sensing face material 6. This is because the eddy-currents themselves produce a magnetic field that opposes the primary field 18, and the eddy-currents at the inner face surface operate to weaken the magnetic field that induces the next deeper layer. This successive reduction in the magnetic field in turn causes successive reduction in eddy-currents with increased depth or penetration into the metal sensing face 6. The inventor has appreciated that this eddy-current decay or decrease in the metal face 6 is exponential and may be characterized by the following equation (4):

$$J_d = J_0 * e^{-d/\delta}, \qquad (4)$$

where $J_d$ is the current density at outer surface of the metal face 6 (at the outer face surface toward the target 100 in FIG. 2), $J_0$ is the current density at inner surface of the metal face 6 (toward the coil 14), d is the metal face thickness 6a in meters, and $\delta$ is the penetration depth of penetration from equation (2) above.

In addition, the eddy-current power dissipation related to eddy-current circulation per unit volume in the metal face 6 is attributable to a Joule effect and can be described by the following equation (5):

$$P_{eddy} = (\pi d^2 \sigma / 6) * (B_{max} f)^2, \qquad (5)$$

where d is the metal face thickness 6a, $\sigma$ is the electrical conductivity of the face material, $B_{max}$ is the maximum value of flux density in the metal face 6, and f is the operating frequency in Hertz. The inventor has thus appreciated that the power loss due to eddy-currents in the face material is proportional to the square of the frequency.

It has further been appreciated that the magnetic field attenuation in the metal sensing face 6 is due at least in part to the opposing magnetic field resulting from the sensing face eddy currents, and that the level of the magnetic field attenuation can be characterized by the following equation (6):

$$K = E_0 / E_x = e^{d(\pi f \mu \sigma)1/2}, \qquad (6)$$

where $E_0$ is the field strength at the inner surface of the sensing face 6, $E_x$ is the field strength at the outer surface facing the target sensing area 7, d is the face thickness 6a, f is the frequency, and $\mu$ and $\sigma$ are the permeability and electrical conductivity of the face material. As a result, the magnetic field attenuation in the metal sensing face 6 is directly proportional to the face thickness 6a of the metal face and to the frequency f.

In addition to the above effects caused by the metal face 6, additional power losses are found when a target object 100 is present in the sensing area 7. In general, the total power loss per unit volume in a conductive ferromagnetic target material includes both eddy-current losses and hysteresis losses, which can be represented by the following equation (7):

$$P = P_{eddy} + P_{hyst} = (\pi d^2 \sigma / 6) * (B_{max} f)^2 + 2f * Hc * B_{max}, \qquad (7)$$

where d is the thickness of the target material 100 that is perpendicular to the field direction, $\sigma$ is the electrical conductivity of the target material, $B_{max}$ is the maximum flux density at the target object 100, and Hc is the coercivity of the target 100 in Oersteds or amps/meter.

The eddy-current power loss component for the target 100 ($P_{eddy} = (\pi d^2 \sigma / 6) * (B_{max} f)^2$) is evaluated according to the above equation (5) using the corresponding values (e.g., conductivity, thickness) of the target 100. The hysteresis loss component ($P_{hyst} = 2f * Hc * B_{max}$) for ferromagnetic target materials is attributable to movement of domain walls determined by a characteristic magnetizing (hysteresis) curve for the material, where the term $Hc * B_{max}$ is representative of the area inside the hysteresis curve for that material. Thus, depending on the particular target material, the ratio between target eddy-currents losses and target hysteresis losses will change. For instance, steel target materials will have a wider hysteresis curve with more area than will stainless steel or other non-ferrous target materials. Consequently, the hysteresis loss component will be significant for steel targets 100, whereas eddy-currents losses will predominate for targets made of stainless steel or other non-ferrous metals like a copper, aluminum, brass, etc.

Also of note in equation (7) is the proportionality of the target losses to the operating frequency f of the magnetic field. As a result, increasing the frequency f will increase the target loss effect because of the high level of energy losses in the material of the target 100. Thus, the presence of the target object 100 will change the overall power losses in the coil system 10. Moreover, this power loss is seen as a change in the effective resistance of the coil system 10. The inventor has appreciated, in this regard, that the effective coil resistance can be used to characterize the face and target losses for a given set of parameters for the sensing face 6 and the target 100 in order to define a relative target effect for the sensing face area, material, and thickness, and a target material from which the target object is made. One exemplary relative target effect $\Delta_T$ is expressed in the following equation (8):

$$\Delta_T(\%) = (R_E - R_{E-T})/R_E * 100\%, \qquad (8)$$

where $R_E$ is the equivalent series resistance in the coil 14 with the target object 100 present in the target sensing area, and where $R_{E-T}$ is the equivalent series resistance of the coil 14 without the target 100. Any suitable relative target effect characterization or relationship may be employed which represents the relative effect of the target presence with respect to a measurable coil system parameter as a function of frequency or face thickness 6a for a given set of sensing face and target materials and sensing face area, and which can be correlated with sensing distance 102, wherein the present disclosure is not limited to the illustrated example of equation (8).

In the case of the exemplary resonant tank circuit (e.g., FIGS. 3 and 4 above), small changes of effective resistance of the coil system 10 are converted to impedance changes of the resonant tank as a whole, where the resonant tank circuit impedance Z can be described by the following equation (9):

$$Z = L/CR_E. \qquad (9)$$

In addition, the real part of the coil system impedance $R_E$ is representative of the power losses in the coil 14, which can be described by the following equation (10):

$$R_E = R_{DC} + R_{SKIN} + R_{PROX} + R_F + R_T + R_{OTHER}, \qquad (10)$$

where $R_{DC}$ is the DC coil resistance (e.g., copper resistance of the coil windings), $R_{SKIN}$ is the skin effect power loss in the conductor, $R_{PROX}$ is the proximity loss resistance due to proximity effect in the coil conductors, $R_F$ is the variable component due to power loss in the metal face 6, $R_T$ is the variable component due to power loss in the target 100, and $R_{OTHER}$ is the variable component due to power loss in all other conducting parts of the sensor 2 (e.g., housing 4, magnetic shield 20, etc.). For low frequency operation, the parameters $R_{SKIN}$ and $R_{PROX}$ have been found to be small and can be ignored.

The presently disclosed sensors 2 and methods can be advantageously employed to achieve maximum or near-maximum relative target effect $\Delta_T$ in metal face inductive proximity sensors 2 and provides design criteria for selection of the operating frequency of the magnetic field in the coil and the metal face thickness 6a. In metal face sensors 2, the alternating magnetic field 18 generated by the coil 14 attenuates in the metal face 6 and produces eddy-current in the face 6, which in turn, produce an opposing magnetic field which interacts with the coil magnetic field 18. The inventor has appreciated that the equivalent power loss in the metal face 6 depends on the operating frequency f as well as the material properties, active surface area, and thickness of the metal face 6. Moreover, the inventor has appreciated that the magnetic field induced in the target material, produces eddy current in the target object 100, which in turn produces an opposing magnetic field that interacts with the initial field 18. The equivalent power loss in the target is characterized as the target resistance component of the coil system impedance $R_T$, which includes two components. These are the $R_{TE}$ component attributable to eddy-current losses in the target structure 100, and $R_{TH}$, which relates to hysteresis losses in the target 100. Both these target loss components are frequency dependant and are dependent upon the target material, where one or both of these will contribute to $R_T$ based on whether the target is ferrous or not. Thus, the metal sensing face 6 acts as a frequency dependent magnetic flux attenuator for a magnetic flux induced in the target. At very low frequencies, this face attenuation is minimal, although losses in the target 100 are also low, whereby the relative target effect $R_T$ is minimal, as shown in the following relative target effect curves. Moreover, at very high frequencies, the losses in the target 100 are maximal but the magnetic field attenuation in the face 6 is also maximal. Consequently, the target affect $R_T$ is also minimal for very high frequencies.

In this regard, conventional metal face inductive sensor design concepts did not recognize these countervailing influences at high and low frequencies. The present disclosure, on the other hand, capitalizes on these effects to provide for intelligent operating frequency selection based on the active sensing face surface area and face thickness 6a, electrical conductivity and permeability of the metal face material, and the properties of the target material, based on the appreciation that for each metal face thickness 6a there is a frequency associated with a local or global maxima for the target effect that will provide the maximum target effect, and hence optimize the sensing distance 102 of the sensor 2.

Thus, the present disclosure provides for operation of the sensor 2 at a frequency in a range that includes a value that maximizes the relative target effect $\Delta_T$ for the area, material, and thickness of the metal sensing face 6 and the material from which the target object 100 is made. This provides a competent design criteria for frequency selection that may be employed to achieve a maximum target effect, thereby ensuring the maximum sensing distance 102 while providing the protection benefits of a metal sensing face 6. In one possible application, or instance, the sensing face material and thickness 6a can be selected to achieve a specified amount of protection from environmental elements such as dust, dirt, moisture, exposure to corrosive materials, impacts from moving target objects 100, etc. With the face thickness 6a and material set, for a given sensor size (e.g., 8, 12, 18, 30 mm diameter) and target material type (e.g., stainless steel, steel, aluminum, brass, etc.), the relative target effect can be ascertained as a function of operating frequency f by finite element analysis (FEA) or other suitable technique to provide a curve from which the operating point can be selected. In another possible approach, a frequency can be selected and the face thickness 6a can be selected according to a relative target effect curve as a function of face thickness.

Figure 9:
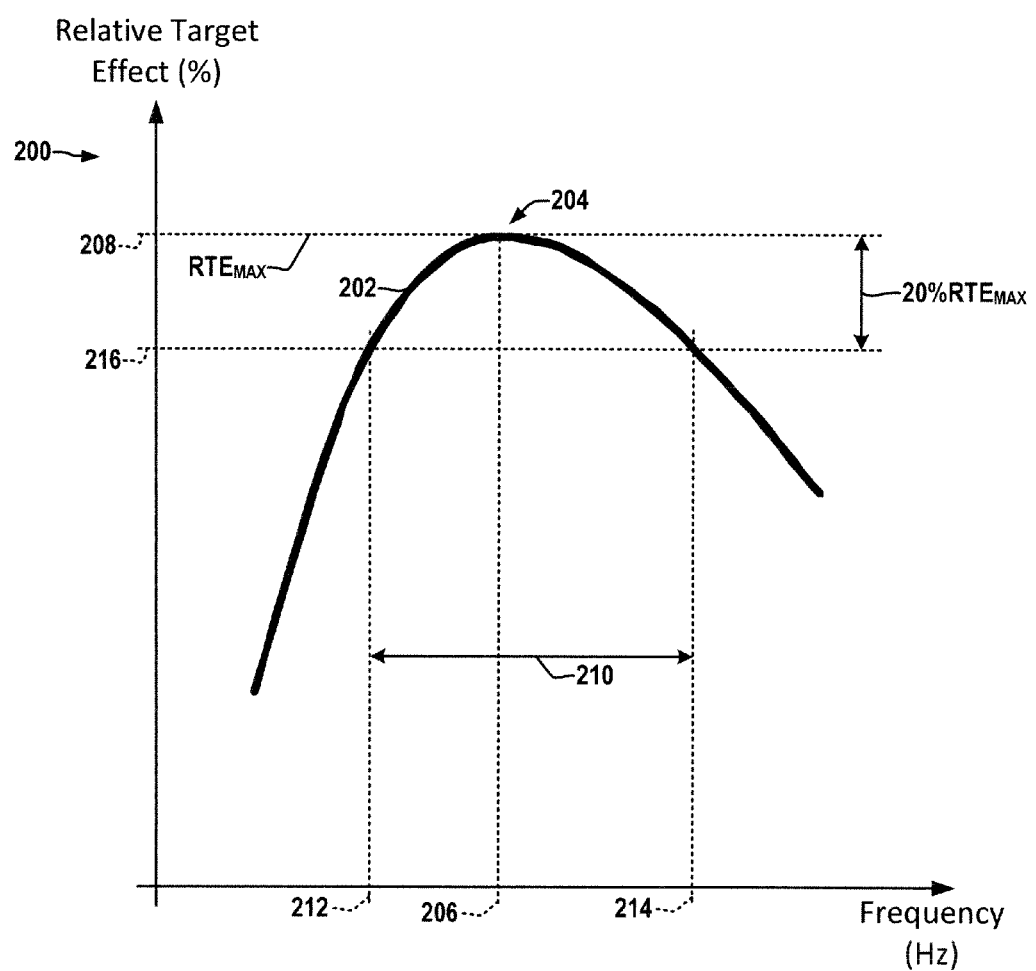
FIG. 9 is a graph showing a relative target effect vs. frequency curve for a steel face inductive proximity sensor in accordance with the present disclosure.

FIG. 9 depicts a graph 200 showing a percent relative target effect curve 202 as a function of frequency for a metal face inductive proximity sensor in accordance with various aspects of the present disclosure. As appreciated by the inventor, the curve 202 includes a relative maxima 204 at a frequency 206 at which the relative target effect equals its local maximum value 208 for a given sensing face area, material, thickness, and target material from which the target object is made. The disclosure contemplates that operation of a given sensor at this frequency 206 or at a frequency in a frequency range that includes this frequency value 206 provides for improved sensor performance. As shown in FIG. 9, moreover, the invention contemplates advantageously operating the metal face sensor by providing alternating current to the coil at a frequency value in a range 210 between frequencies 212 and 214 at which the relative target effect is within about 20 percent of the global or relative maximum 208, wherein the relative target effect in this range 210 is at or above a value 216 of above 0.8 times the relative maximum value 208 for the design.

Several specific embodiments are now described with respect to FIGS. 5A-8I in which the sensing face 6 is formed of a stainless steel metallic material having a thickness 6a of about 0.3 to 1.0 mm with the sensing face thickness 6a and the operating frequency being set to provide optimal or near optimal sensor performance to provide a maximum sensing distance 102 (e.g., the distance between the outer surface of the sensing face 6 and the target 100 as shown in FIG. 3). In this respect, the inventor has appreciated that the sensing distance is related to the relative target effect and has characterized and studied the relationship between the target material, face material, thickness 6a, and area, in terms of the relative target effect by simulating the target effect as a function of frequency to identify global or relative maxima points in the resulting simulation curves as are shown in FIGS. 5A-8I. In addition, the inventor has appreciated that operation of the metal face sensor 2 at a frequency in a frequency range that includes the relative or global maxima, preferably in a range that includes frequencies for which the relative target effect is within about 20% of the maximum value, provides significant improvements in sensing of the sensor 2.

The following Table 1 includes simulation results for various metal face sensor designs shown in the listed figures for stainless steel faces of different diameters and thicknesses for different target materials, individually listing the simulated maximum relative target effect value along with first and second frequencies (F1 and F2) bounding a range for which the relative target effect is within about 20% of the simulated maximum value.

TABLE 1

| FIG. | Face Diameter (mm) | Target Material | Face Thickness (mm) | Target Distance (mm) | MAX RTE (%) | 0.8 MAX (%) | F1 (Hz) | F2 (Hz) |
|---|---|---|---|---|---|---|---|---|
| 5A | 8.00 | Aluminum | 0.20 | 3.00 | 1.37 | 1.10 | 4,219 | 9,919 |
| 5B | 8.00 | Aluminum | 0.40 | 3.00 | 1.07 | 0.86 | 3,903 | 8,859 |
| 5C | 8.00 | Aluminum | 0.60 | 3.00 | 0.80 | 0.64 | 3,443 | 8,142 |

TABLE 1-continued

| FIG. | Face Diameter (mm) | Target Material | Face Thickness (mm) | Target Distance (mm) | MAX RTE (%) | 0.8 MAX (%) | F1 (Hz) | F2 (Hz) |
|---|---|---|---|---|---|---|---|---|
| 5D | 8.00 | Stainless Steel | 0.20 | 2.00 | 4.53 | 3.62 | 26,262 | 66,174 |
| 5E | 8.00 | Stainless Steel | 0.40 | 2.00 | 2.18 | 1.74 | 19,179 | 46,261 |
| 5F | 8.00 | Stainless Steel | 0.60 | 2.00 | 1.80 | 1.44 | 15,860 | 42,851 |
| 5G | 8.00 | Steel | 0.20 | 3.00 | 5.34 | 4.27 | 24,321 | 72,159 |
| 5H | 8.00 | Steel | 0.40 | 3.00 | 2.75 | 2.20 | 23,229 | 91,093 |
| 5I | 8.00 | Steel | 0.60 | 3.00 | 2.23 | 1.78 | 20,156 | 73,355 |
| 6A | 12.00 | Aluminum | 0.30 | 5.00 | 2.86 | 2.29 | 2,055 | 4,748 |
| 6B | 12.00 | Aluminum | 0.50 | 5.00 | 2.37 | 1.89 | 1,939 | 4,227 |
| 6C | 12.00 | Aluminum | 0.70 | 5.00 | 1.95 | 1.56 | 1,839 | 3,910 |
| 6D | 12.00 | Stainless Steel | 0.30 | 3.50 | 2.08 | 1.67 | 5,083 | 13,439 |
| 6E | 12.00 | Stainless Steel | 0.50 | 3.50 | 1.20 | 0.96 | 7,724 | 19,896 |
| 6F | 12.00 | Stainless Steel | 0.70 | 3.50 | 0.80 | 0.64 | 6,514 | 19,599 |
| 6G | 12.00 | Steel | 0.30 | 5.00 | 2.30 | 1.84 | 10,814 | 52,846 |
| 6H | 12.00 | Steel | 0.50 | 5.00 | 1.91 | 1.52 | 8,778 | 37,024 |
| 6I | 12.00 | Steel | 0.70 | 5.00 | 1.59 | 1.28 | 7,616 | 29,300 |
| 7A | 18.00 | Aluminum | 0.30 | 10.00 | 1.27 | 1.02 | 1,160 | 2,711 |
| 7B | 18.00 | Aluminum | 0.50 | 10.00 | 1.11 | 0.89 | 1,103 | 2,468 |
| 7C | 18.00 | Aluminum | 0.70 | 10.00 | 0.97 | 0.78 | 1,039 | 2,306 |
| 7D | 18.00 | Stainless Steel | 0.30 | 7.00 | 3.09 | 2.47 | 5,842 | 15,603 |
| 7E | 18.00 | Stainless Steel | 0.50 | 7.00 | 2.00 | 1.60 | 4,703 | 11,874 |
| 7F | 18.00 | Stainless Steel | 0.70 | 7.00 | 1.47 | 1.18 | 4,071 | 9,942 |
| 7G | 18.00 | Steel | 0.30 | 10.00 | 2.15 | 1.72 | 6,053 | 27,200 |
| 7H | 18.00 | Steel | 0.50 | 10.00 | 1.98 | 1.58 | 5,286 | 20,745 |
| 7I | 18.00 | Steel | 0.70 | 10.00 | 1.77 | 1.41 | 4,746 | 17,217 |
| 8A | 30.00 | Aluminum | 0.30 | 15.00 | 1.36 | 1.08 | 770 | 1,798 |
| 8B | 30.00 | Aluminum | 0.50 | 15.00 | 1.20 | 0.96 | 724 | 1,656 |
| 8C | 30.00 | Aluminum | 0.70 | 15.00 | 1.09 | 0.87 | 700 | 1,549 |
| 8D | 30.00 | Stainless Steel | 0.30 | 10.00 | 4.15 | 3.32 | 4,310 | 11,632 |
| 8E | 30.00 | Stainless Steel | 0.50 | 10.00 | 2.72 | 2.18 | 3,433 | 8,924 |
| 8F | 30.00 | Stainless Steel | 0.70 | 10.00 | 2.00 | 1.60 | 2,896 | 7,345 |
| 8G | 30.00 | Steel | 0.30 | 15.00 | 2.21 | 1.77 | 4,088 | 19,835 |
| 8H | 30.00 | Steel | 0.50 | 15.00 | 1.94 | 1.56 | 3,529 | 14,834 |
| 8I | 30.00 | Steel | 0.70 | 15.00 | 1.77 | 1.42 | 3,134 | 12,192 |

FIGS. 5A-8I illustrate curves showing that the sensing capabilities of the metal face sensor 2 can be significantly improved by operation in a certain frequency range tailored according to the sensing face area, face material, face thickness, and target material. Exemplary curves are shown in these figures as a function of operating frequency for certain materials, face thicknesses, and areas as set forth in Table 1. In this regard, a relative target effect can be ascertained for a given set of these design parameters and plotted as a function of frequency, face thickness, area, etc., where all such alternative characterizations can be used to provide for tailored sensor operation at a frequency that provides optimal or near-optimal relative target effect and hence maximum or near-maximum sensing distance 102 in accordance with the present disclosure. In this manner, the inventor has appreciated, contrary to conventional design approaches for inductive proximity sensors, that such a relative target effect curve will include a global maxima and/or multiple local maximas, such that operation in the frequency range that includes a value that maximizes a relative target effect will optimize or significantly improve the sensing distance 102. The present disclosure thus facilitates the provision of inductive proximity sensors 2 with the protection of conventional metal sensing face materials while enhancing sensing distance 102 by reducing the amount of field and energy depletion effects of the metal face 6 and enhancing the energy loss at the target object 100 so as to optimize the relative ratio of the target loss to the metal face loss.

The graphs in FIGS. 5A-8I show relative target effect $\Delta_T$ vs. frequency for a sensor 2 having various diameters (e.g., 8 mm diameter in FIGS. 5A-5H, 12 mm diameter in FIGS. 6A-6I, 18 mm diameter in FIGS. 7A-7I, and 30 mm diameter in FIGS. 8A-8I) for sensors 2 constructed with a stainless steel metallic face material of a thickness 6a of about 0.2 to 1.0 mm. Moreover, as shown in Table 1 above, different target materials and face thicknesses were simulated for each face diameter. The curves include maximum relative target effect values, wherein a preferred operating frequency range is determined according to the present disclosure by determining frequencies for which the relative target effect is within about 20% of the simulated maximum value.

Figure 5A:
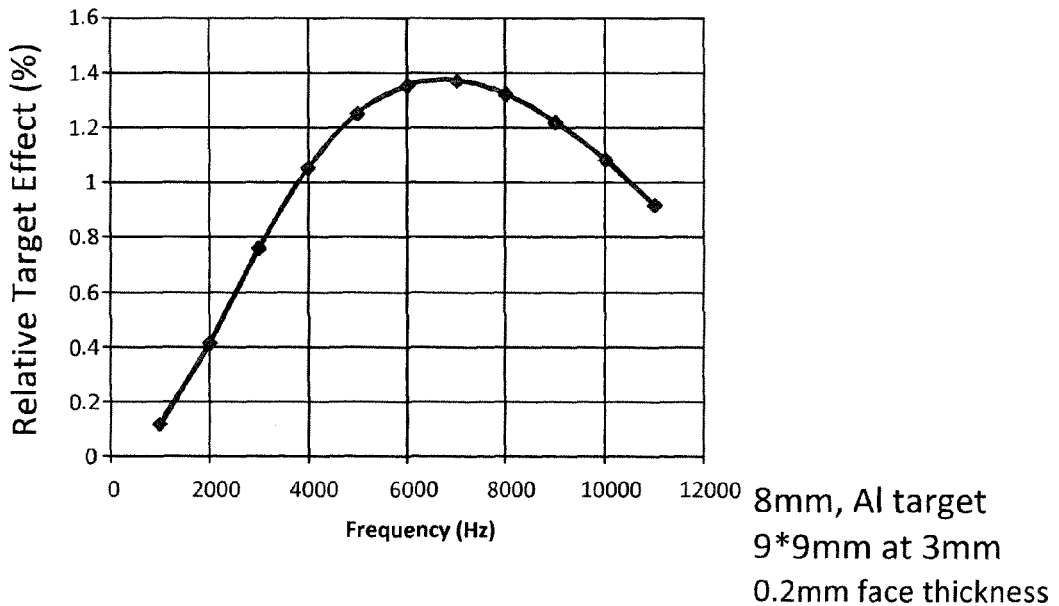
FIGS. 5A-8I are graphs showing relative target effect vs. frequency curves for 8, 12, 18, and 30 mm diameter stainless steel face inductive proximity sensors with various face thicknesses for sensing steel, stainless steel, and aluminum target objects in accordance with the present disclosure.
Figure 5B:
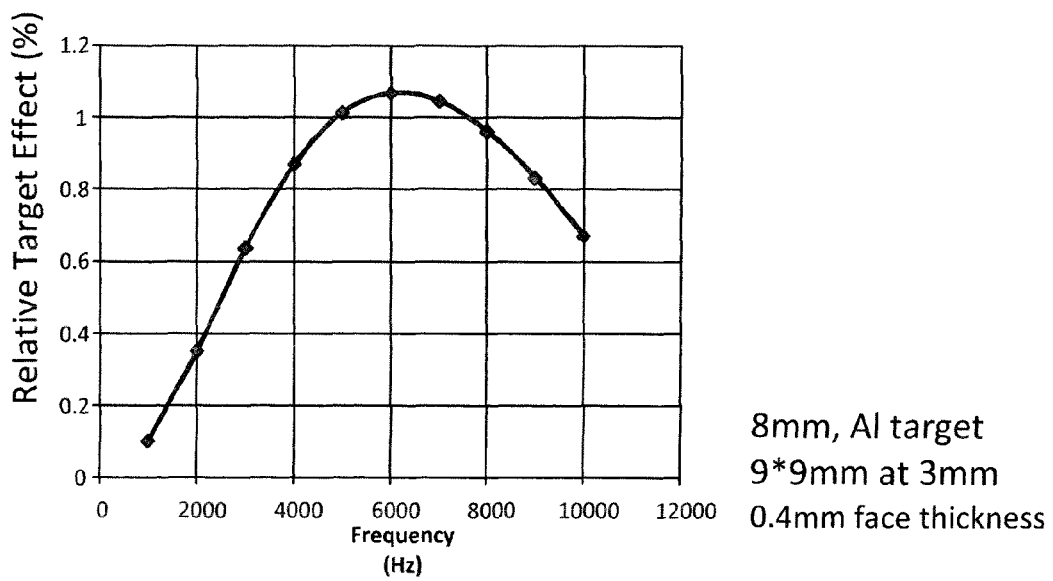
Figure 5C:
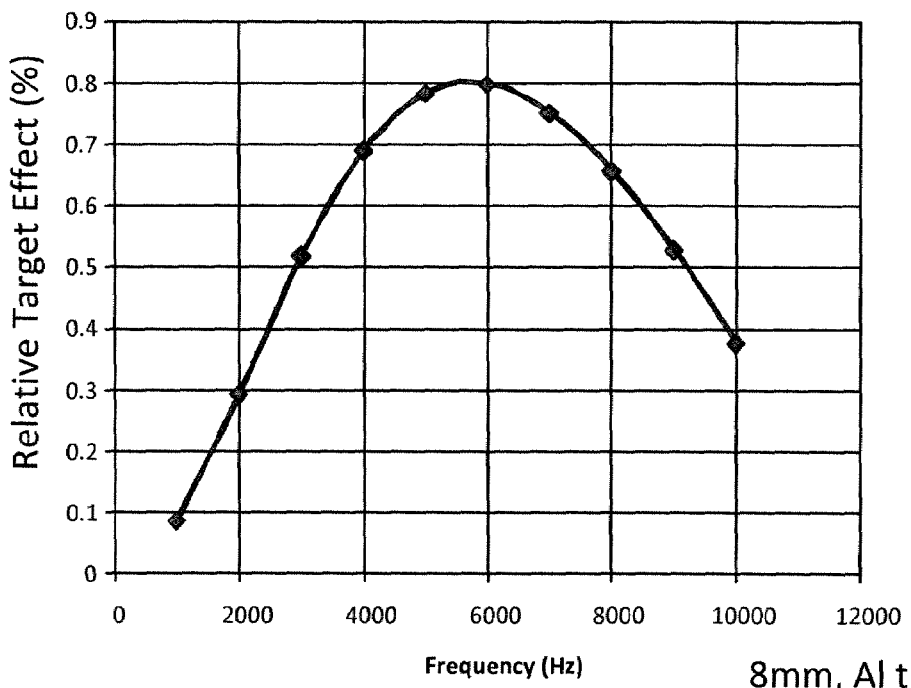

In the illustrated embodiments of FIGS. 5A-5H and Table 1, the sensor 2 includes a circular stainless steel metal face 6 having a diameter of about 8 mm (e.g., +/−10%) and a thickness of about 0.2 to 1.0 mm (e.g., +/−10%). As shown in FIGS. 5A-5C for an aluminum target material, the frequency value is preferably about 3,443 to about 9,919 Hz. As shown in FIG. 5A, for a sensing face thickness 6a of about 0.2 mm (e.g., +/−10%), the frequency value preferably about 4,219 to about 9,919 Hz based on a simulated maximum relative target effect value of 1.37% at about 7,000 Hz, where this preferred frequency range provides for the global or relative maximum sensing distance in which the relative target effect is at or above about 80% of the simulated maximum (e.g., about 1.10% relative target effect or higher, +/−10%). In this regard, the simulations for this case were done at 1,000 Hz intervals from 1,000 to 11,000 Hz, wherein an absolute maximum point may be found by simulating at a larger number of frequency points. However, as noted in FIG. 5A, the simulated maximum point (RTE of 1.37% at 7,000 Hz) is approximately the same as the actual maximum, wherein the simulation granularity is preferably such that the simulated maximum is within 10% of the actual maximum. As shown in FIG. 5B for a 0.4 mm face thickness, the preferred operating frequency is in a range from about 3,903 Hz to about 8,859 Hz. FIG. 5C illustrates the case where the sensing face thickness is about 0.6 mm, where the preferred operating frequency is in a range from about 3,443 Hz to about 8,142 Hz, where the preferred frequency ranges in the cases of FIGS. 5B and 5C include values for which the relative target effect is at or above about 80% of the maximum.

Similarly, the remaining FIGS. 5D-8I provide such granularity, with the simulated maximum relative target effect values, the 80% relative target effect values, and the corresponding 80% RTE frequency boundary values F1 and F2 being listed in Table 1. In addition, the simulation data for the illustrated cases of FIGS. 5A-8I is listed below.

Figure 5D:
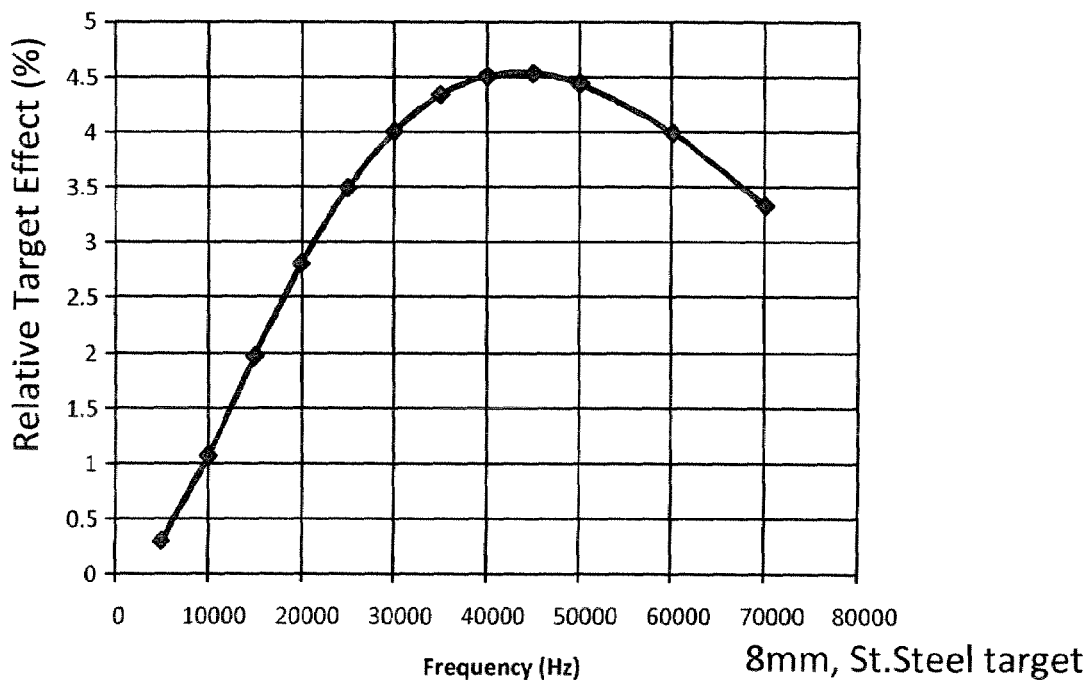
Figure 5E:
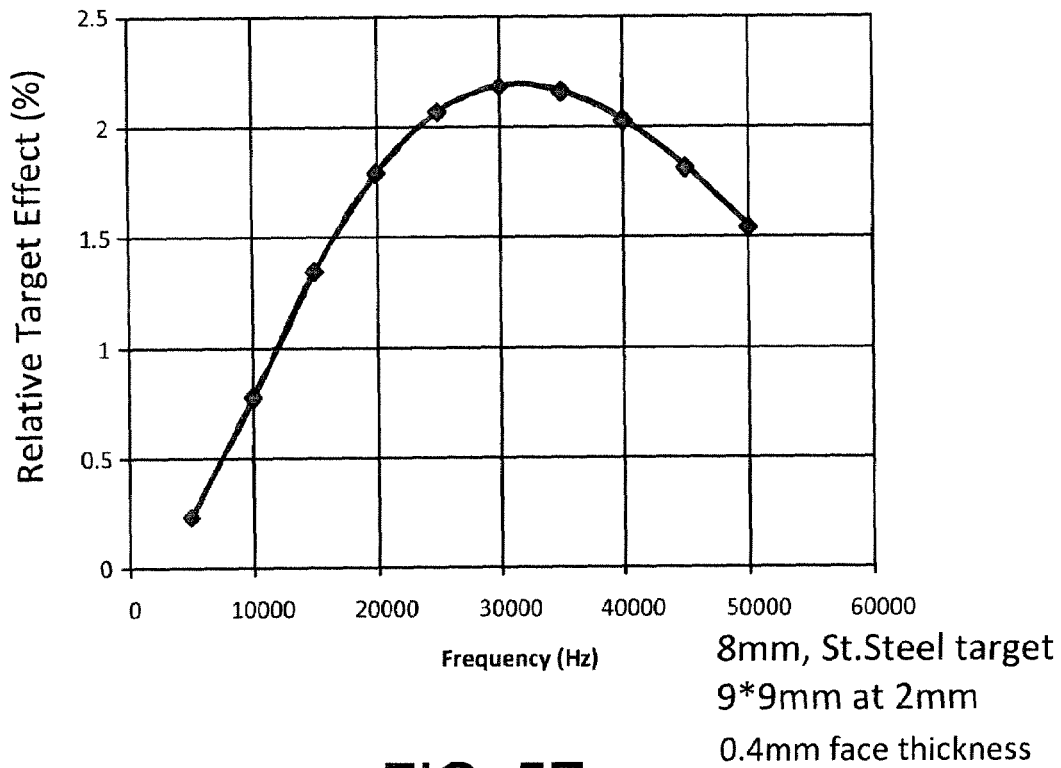
Figure 5F:
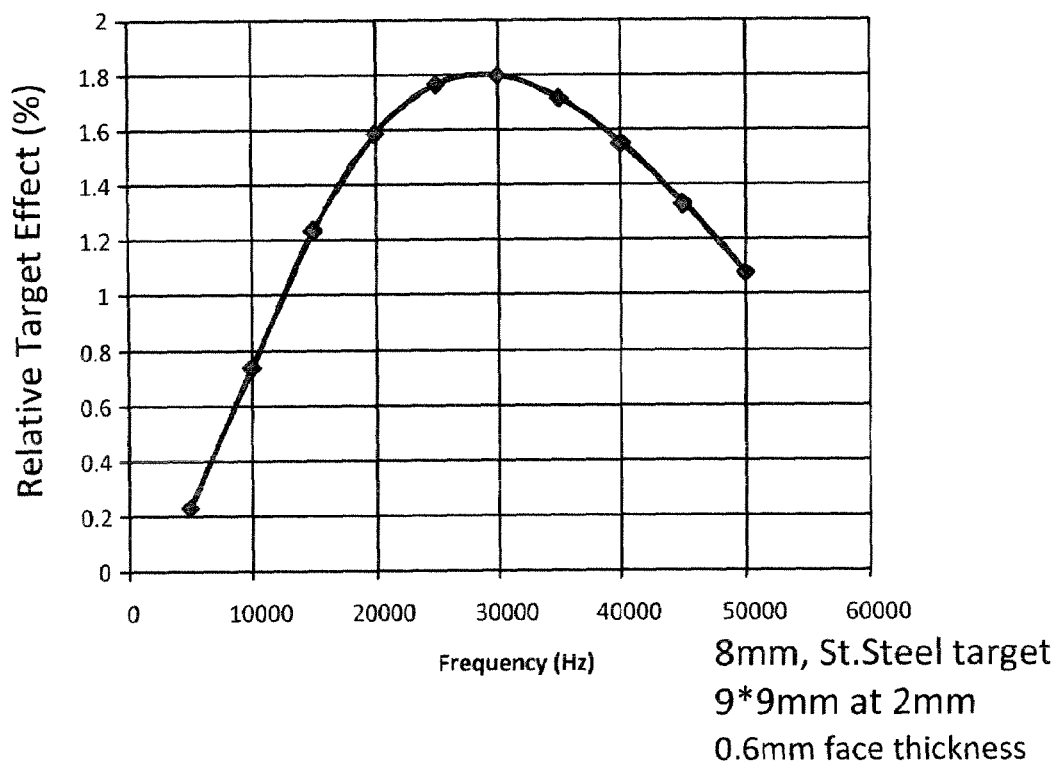
Figure 5G:
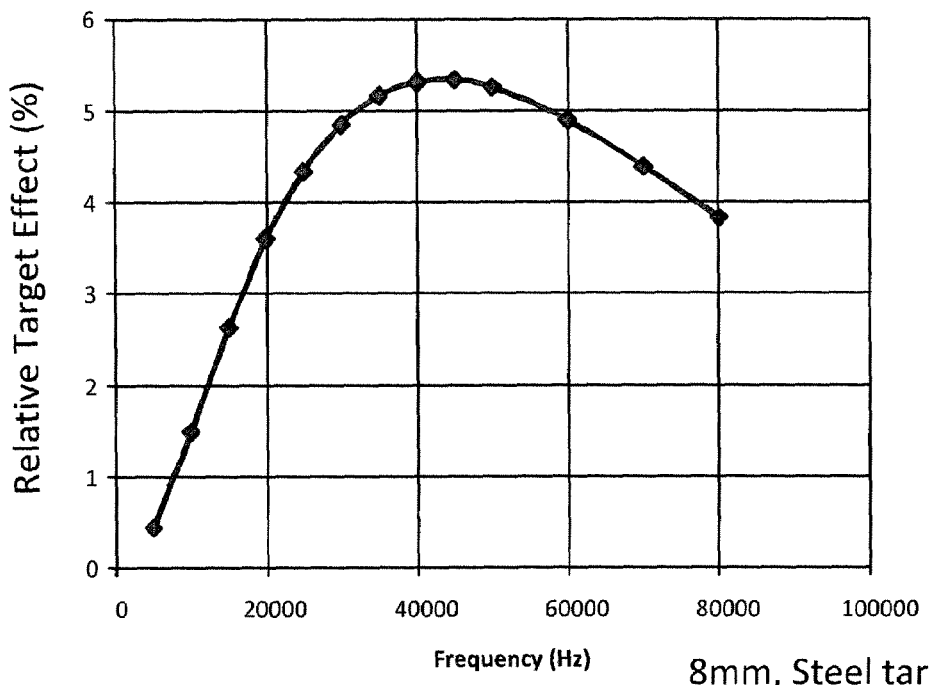
Figure 5H:
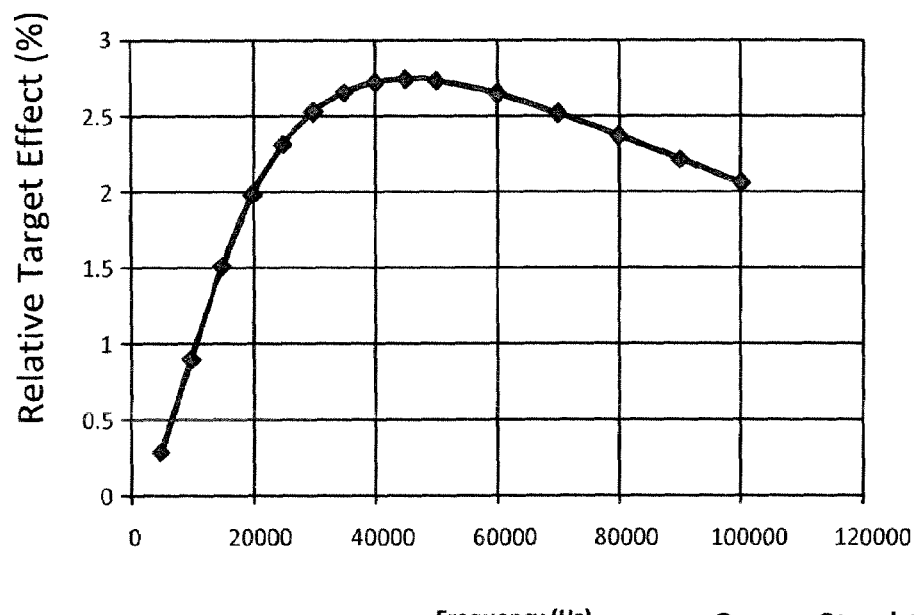

| 8 mm diameter Stainless Steel Metal Face | |
|---|---|
| Frequency (Hz) | Relative target effect (%) |
| FIG. 5A | |
| 1000 | 0.119947 |
| 2000 | 0.416399 |
| 3000 | 0.760934 |
| 4000 | 1.053829 |
| 5000 | 1.252817 |
| 6000 | 1.354193 |
| 7000 | 1.371701 |
| 8000 | 1.322102 |
| 9000 | 1.221711 |
| 10000 | 1.084101 |
| 11000 | 0.919768 |
| FIG. 5B | |
| 1000 | 0.101603 |
| 2000 | 0.350863 |
| 3000 | 0.635742 |
| 4000 | 0.868945 |
| 5000 | 1.013983 |
| 6000 | 1.068542 |
| 7000 | 1.045465 |
| 8000 | 0.961581 |
| 9000 | 0.831961 |
| 10000 | 0.66974 |
| FIG. 5C | |
| 1000 | 0.086196 |
| 2000 | 0.293025 |
| 3000 | 0.518623 |
| 4000 | 0.690682 |
| 5000 | 0.783244 |
| 6000 | 0.798937 |
| 7000 | 0.752065 |
| 8000 | 0.657405 |
| 9000 | 0.52867 |
| 10000 | 0.376751 |
| FIG. 5D | |
| 5000 | 0.308231 |
| 10000 | 1.072441 |
| 15000 | 1.971262 |
| 20000 | 2.808817 |
| 25000 | 3.497713 |
| 30000 | 4.008433 |
| 35000 | 4.341144 |
| 40000 | 4.508268 |
| 45000 | 4.533337 |
| 50000 | 4.440811 |
| 60000 | 3.995776 |
| 70000 | 3.337527 |
| 80000 | 2.581774 |
| FIG. 5E | |
| 5000 | 0.236224 |
| 10000 | 0.778446 |
| 15000 | 1.34891 |
| 20000 | 1.793264 |
| 25000 | 2.069883 |
| 30000 | 2.184824 |
| 35000 | 2.161885 |
| 40000 | 2.03026 |
| 45000 | 1.816465 |
| 50000 | 1.544518 |
| 60000 | 0.901828 |
| FIG. 5F | |
| 5000 | 0.230274 |
| 10000 | 0.738957 |
| 15000 | 1.23782 |
| 20000 | 1.587332 |
| 25000 | 1.766487 |
| 30000 | 1.79874 |
| 35000 | 1.715259 |
| 40000 | 1.550533 |
| 45000 | 1.330848 |
| 50000 | 1.07919 |
| 60000 | 0.542709 |
| FIG. 5G | |
| 5000 | 0.452071 |
| 10000 | 1.499436 |
| 15000 | 2.639378 |
| 20000 | 3.609478 |
| 25000 | 4.345282 |
| 30000 | 4.856608 |
| 35000 | 5.171833 |
| 40000 | 5.323129 |
| 45000 | 5.344743 |
| 50000 | 5.265185 |
| 60000 | 4.903524 |
| 70000 | 4.395621 |
| 80000 | 3.840616 |
| FIG. 5H | |
| 5000 | 0.286751 |
| 10000 | 0.89677 |
| 15000 | 1.507732 |
| 20000 | 1.983191 |
| 25000 | 2.313498 |
| 30000 | 2.528919 |
| 35000 | 2.658211 |
| 40000 | 2.724968 |
| 45000 | 2.745664 |
| 50000 | 2.734447 |
| 60000 | 2.649919 |
| 70000 | 2.519516 |
| 80000 | 2.369147 |
| 90000 | 2.213357 |
| 100000 | 2.059406 |

8 mm diameter Stainless Steel Metal Face

Figure 5I:
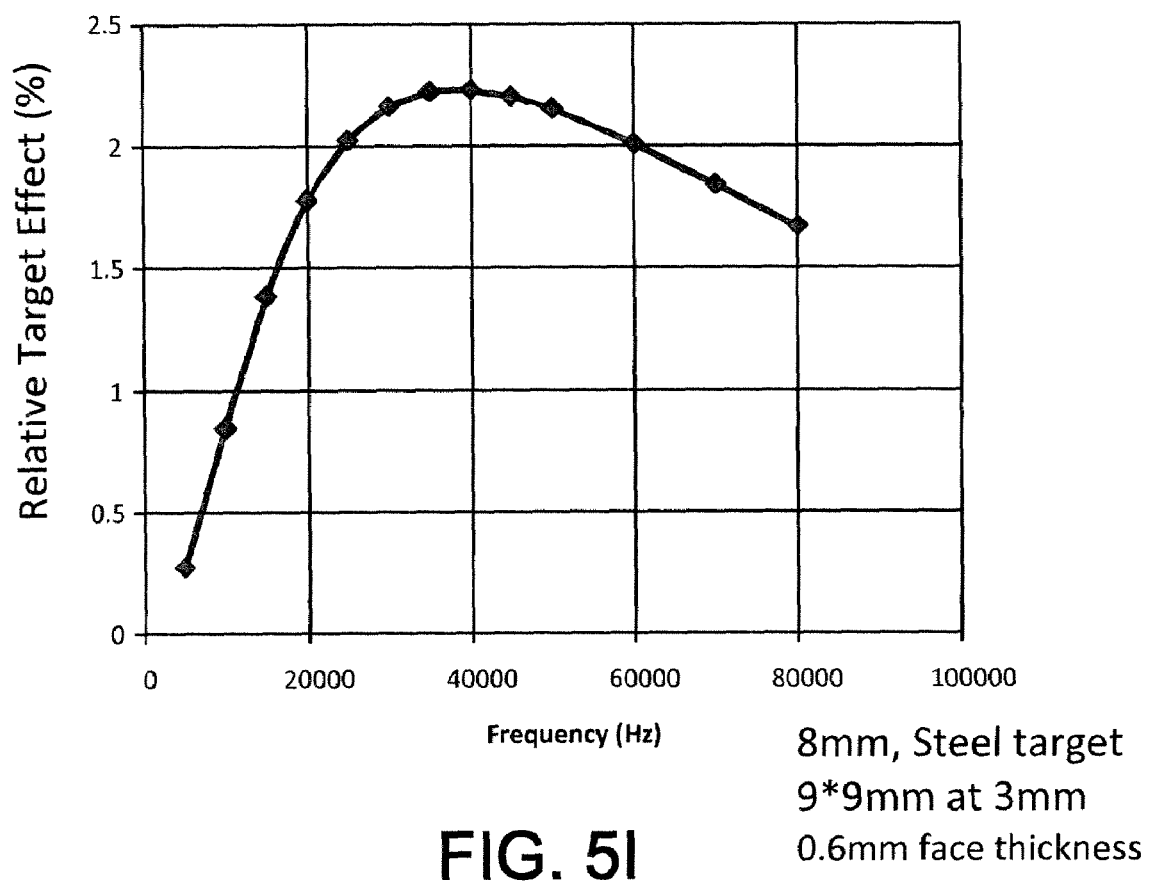

| Frequency (Hz) | Relative target effect (%) |
|---|---|
| FIG. 5I | |
| 5000 | 0.273812 |
| 10000 | 0.8426 |
| 15000 | 1.384253 |
| 20000 | 1.775654 |
| 25000 | 2.022746 |
| 30000 | 2.16006 |
| 35000 | 2.220586 |
| 40000 | 2.229211 |
| 45000 | 2.202237 |
| 50000 | 2.151556 |
| 60000 | 2.008748 |
| 70000 | 1.841233 |
| 80000 | 1.668739 |

12 mm diameter Stainless Steel Metal Face

Figure 6A:
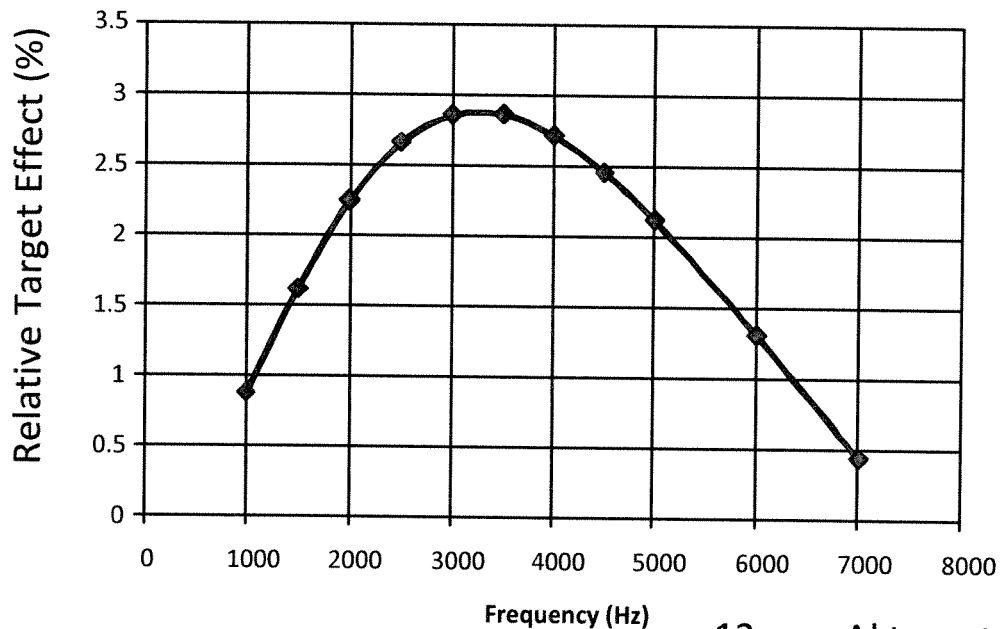
Figure 6B:
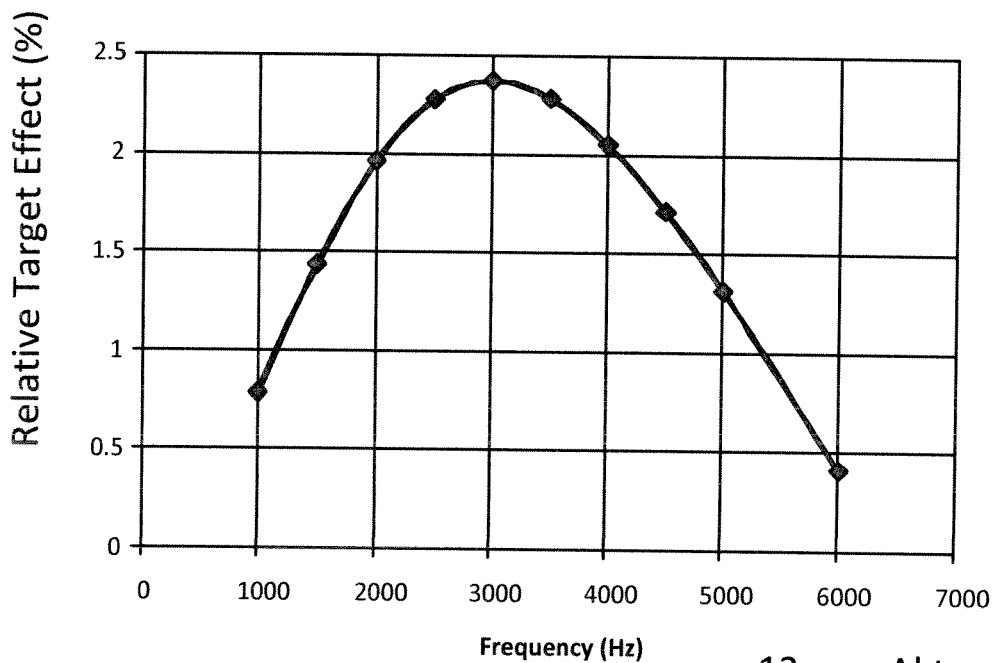
Figure 6C:
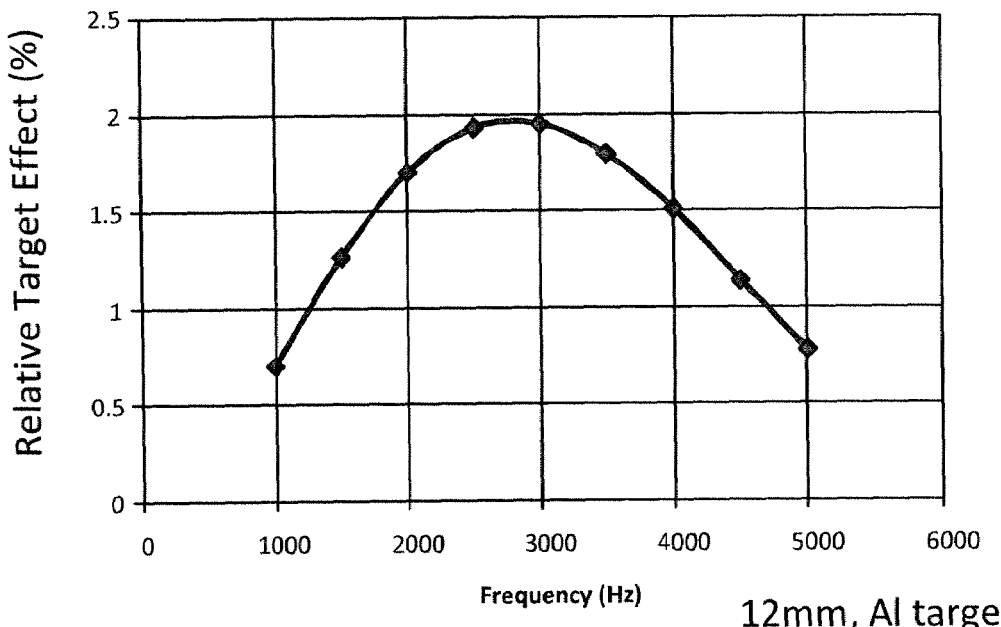
Figure 6D:
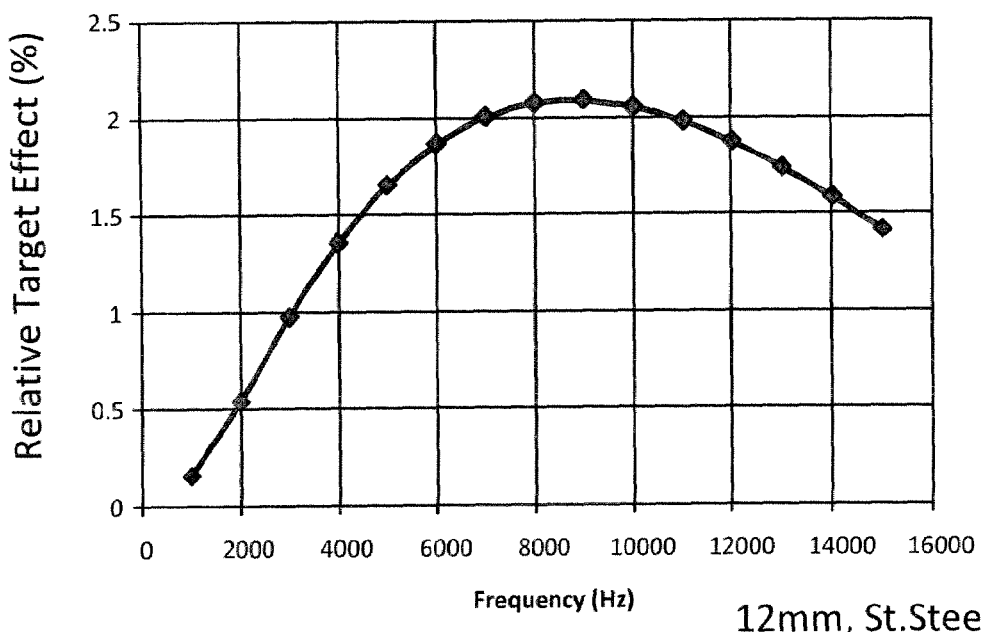
Figure 6E:
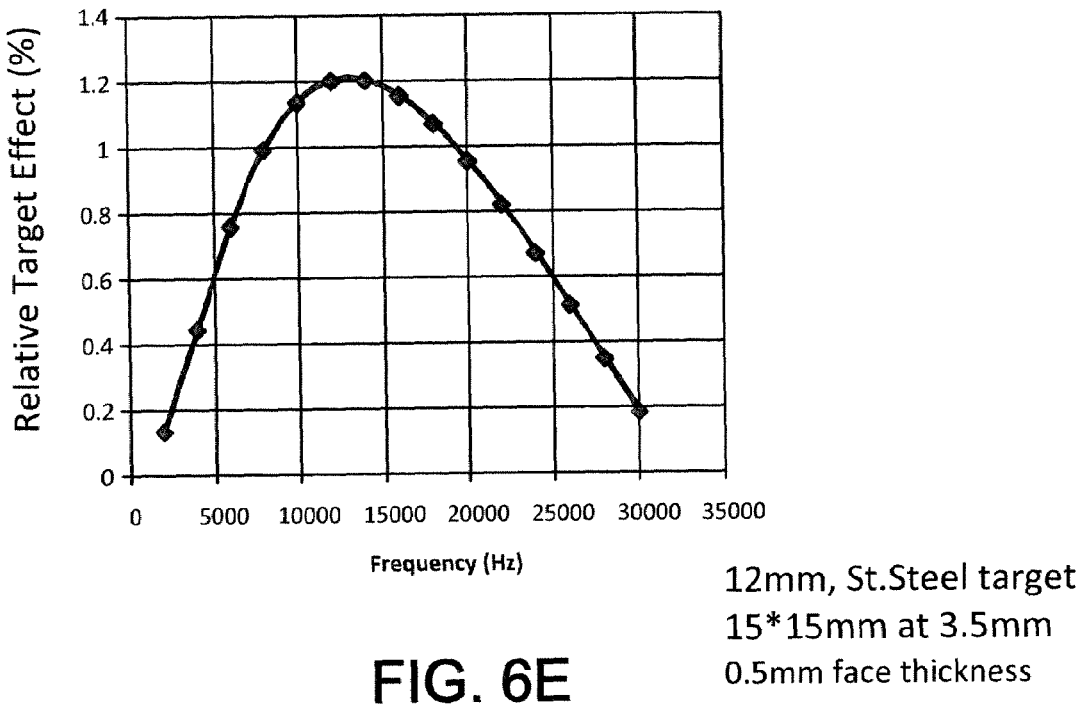
Figure 6F:
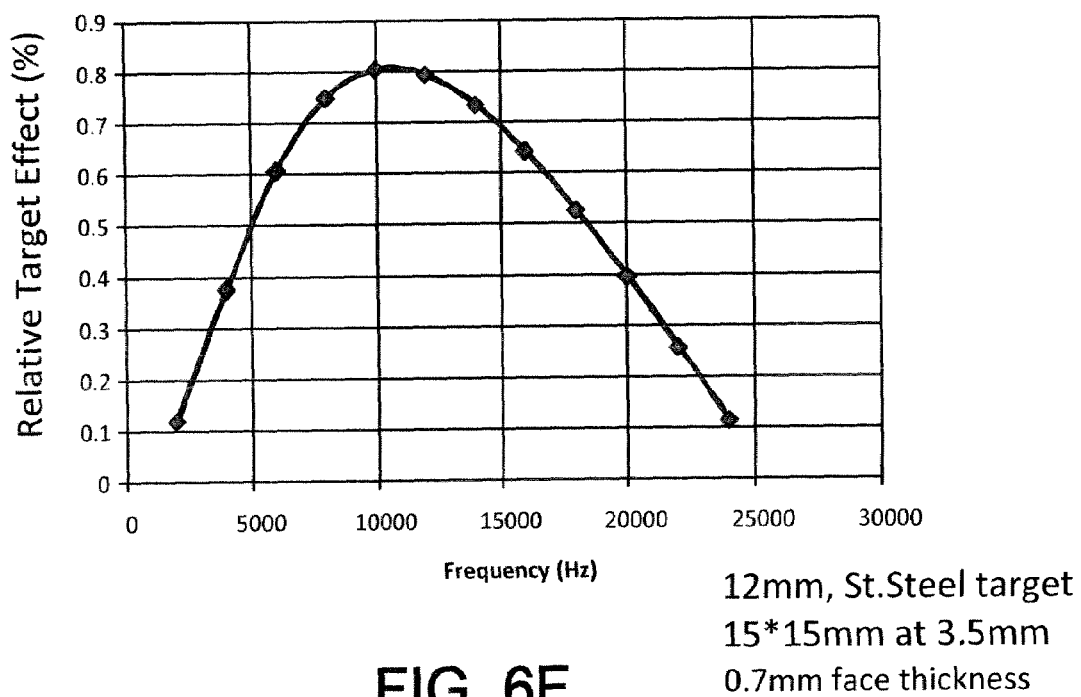
Figure 6G:
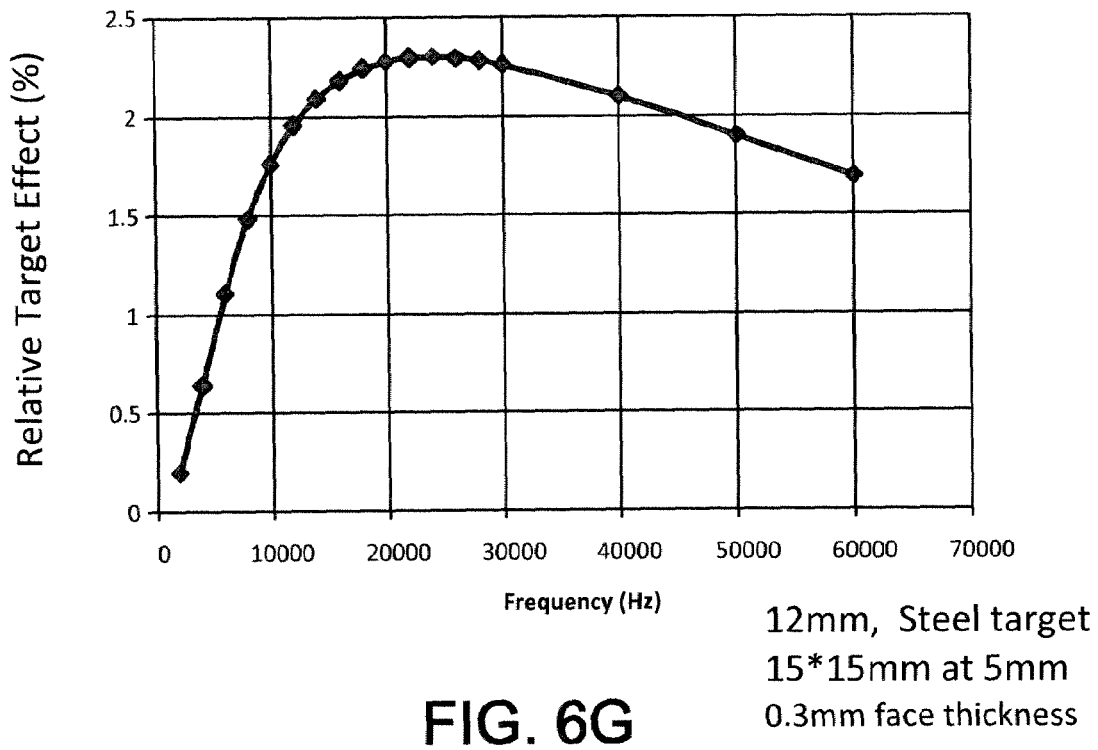
Figure 6H:
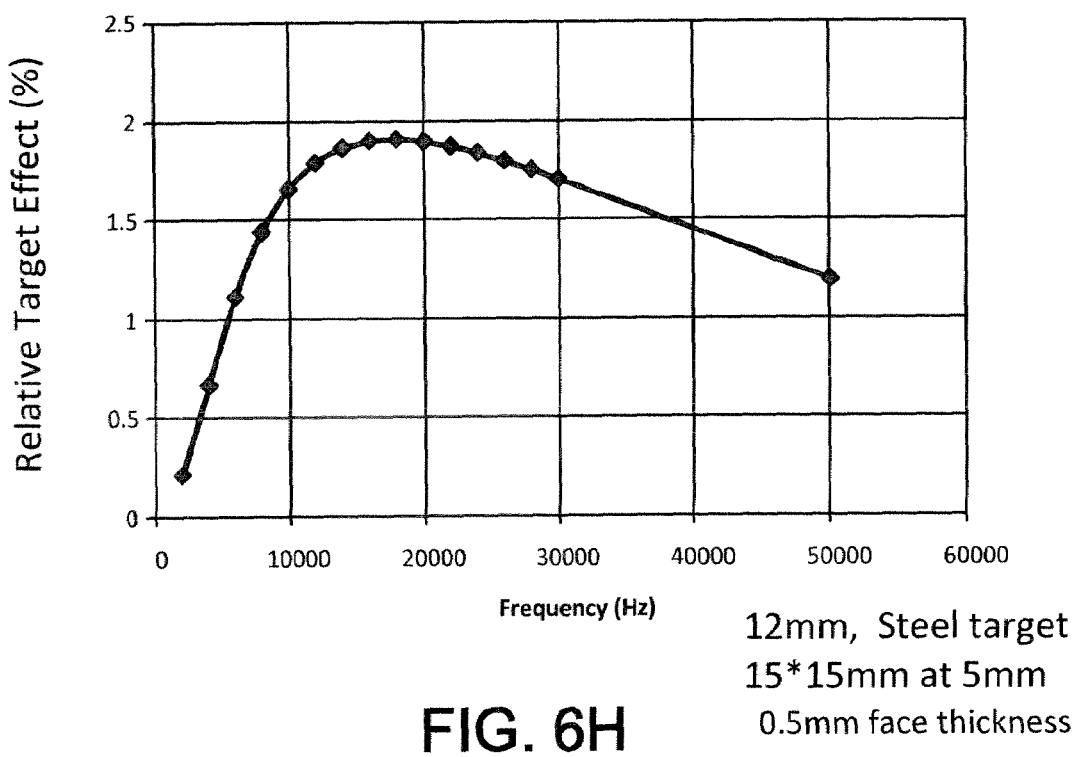

| Frequency (Hz) | Relative target effect (%) |
|---|---|
| FIG. 6A | |
| 1000 | 0.880519 |
| 1500 | 1.616707 |
| 2000 | 2.243545 |
| 2500 | 2.660661 |
| 3000 | 2.857067 |
| 3500 | 2.861956 |
| 4000 | 2.715279 |
| 4500 | 2.456494 |
| 5000 | 2.11956 |
| 6000 | 1.311022 |
| 7000 | 0.439601 |
| FIG. 6B | |
| 1000 | 0.788971 |
| 1500 | 1.43429 |
| 2000 | 1.959146 |
| 2500 | 2.272991 |
| 3000 | 2.368724 |
| 3500 | 2.278987 |
| 4000 | 2.046162 |
| 4500 | 1.712344 |
| 5000 | 1.311001 |
| 6000 | 0.413385 |
| FIG. 6C | |
| 1000 | 0.701845 |
| 1500 | 1.262869 |
| 2000 | 1.698809 |
| 2500 | 1.927963 |
| 3000 | 1.947597 |
| 3500 | 1.792208 |
| 4000 | 1.506855 |
| 4500 | 1.133149 |
| 5000 | 0.776296 |
| FIG. 6D | |
| 1000 | 0.158812 |
| 2000 | 0.539077 |
| 3000 | 0.970961 |
| 4000 | 1.351672 |
| 5000 | 1.649075 |
| 6000 | 1.862168 |
| 7000 | 1.999125 |
| 8000 | 2.069739 |
| 9000 | 2.08341 |
| 10000 | 2.049045 |
| 11000 | 1.974612 |
| 12000 | 1.86762 |
| 13000 | 1.734262 |
| 14000 | 1.580393 |
| 15000 | 1.410517 |
| FIG. 6E | |
| 2000 | 0.136996 |
| 4000 | 0.446182 |
| 6000 | 0.75993 |
| 8000 | 0.994259 |
| 10000 | 1.137142 |
| 12000 | 1.201086 |
| 14000 | 1.202423 |
| 16000 | 1.154812 |
| 18000 | 1.06964 |
| 20000 | 0.956032 |
| 22000 | 0.821672 |
| 24000 | 0.67266 |
| 26000 | 0.514266 |
| 28000 | 0.350877 |
| 30000 | 0.186107 |
| FIG. 6F | |
| 2000 | 0.120193 |
| 4000 | 0.375826 |
| 6000 | 0.607074 |
| 8000 | 0.748968 |
| 10000 | 0.804439 |
| 12000 | 0.793308 |
| 14000 | 0.734228 |
| 16000 | 0.641639 |
| 18000 | 0.526164 |
| 20000 | 0.395828 |
| 22000 | 0.256993 |
| 24000 | 0.114511 |
| FIG. 6G | |
| 2000 | 0.202385 |
| 4000 | 0.64487 |
| 6000 | 1.10785 |
| 8000 | 1.484075 |
| 10000 | 1.760197 |
| 12000 | 1.955033 |
| 14000 | 2.089776 |
| 16000 | 2.181058 |
| 18000 | 2.240514 |
| 20000 | 2.276511 |
| 22000 | 2.294739 |
| 24000 | 2.299414 |
| 26000 | 2.293538 |
| 28000 | 2.279583 |
| 30000 | 2.258778 |
| 40000 | 2.099068 |
| 50000 | 1.898268 |
| 60000 | 1.691914 |
| FIG. 6H | |
| 2000 | 0.214776 |
| 4000 | 0.66842 |
| 6000 | 1.111539 |
| 8000 | 1.440599 |
| 10000 | 1.656764 |
| 12000 | 1.788777 |
| 14000 | 1.862937 |
| 16000 | 1.897837 |
| 18000 | 1.905815 |
| 20000 | 1.895051 |
| 22000 | 1.87094 |
| 24000 | 1.837496 |
| 26000 | 1.797109 |
| 28000 | 1.75211 |
| 30000 | 1.70388 |
| 50000 | 1.193555 |

12 mm diameter Stainless Steel Metal Face

Figure 6I:
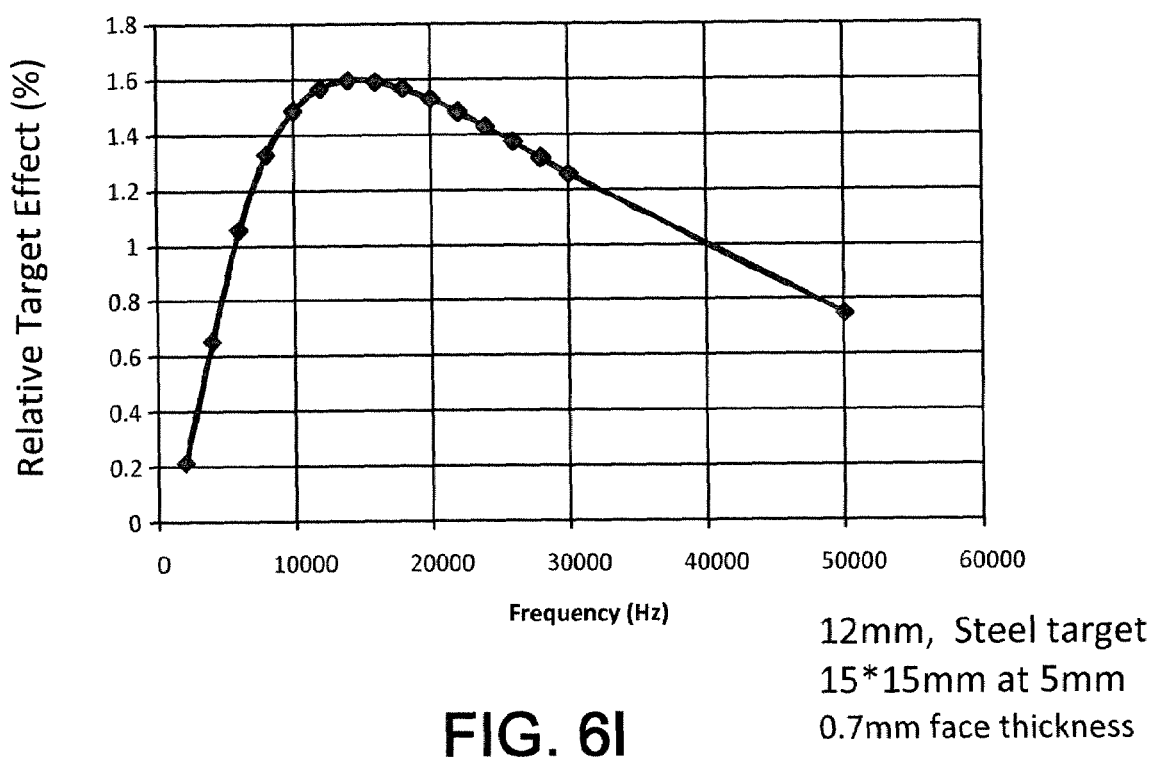

| Frequency (Hz) | Relative target effect (%) |
|---|---|
| FIG. 6I | |
| 2000 | 0.215468 |
| 4000 | 0.654765 |
| 6000 | 1.055858 |
| 8000 | 1.328086 |
| 10000 | 1.486462 |
| 12000 | 1.56603 |
| 14000 | 1.594691 |
| 16000 | 1.590754 |
| 18000 | 1.565886 |
| 20000 | 1.527407 |
| 22000 | 1.480248 |
| 24000 | 1.427353 |
| 26000 | 1.371276 |
| 28000 | 1.313457 |
| 30000 | 1.255446 |
| 50000 | 0.748559 |

18 mm diameter Stainless Steel Metal Face

Figure 7A:
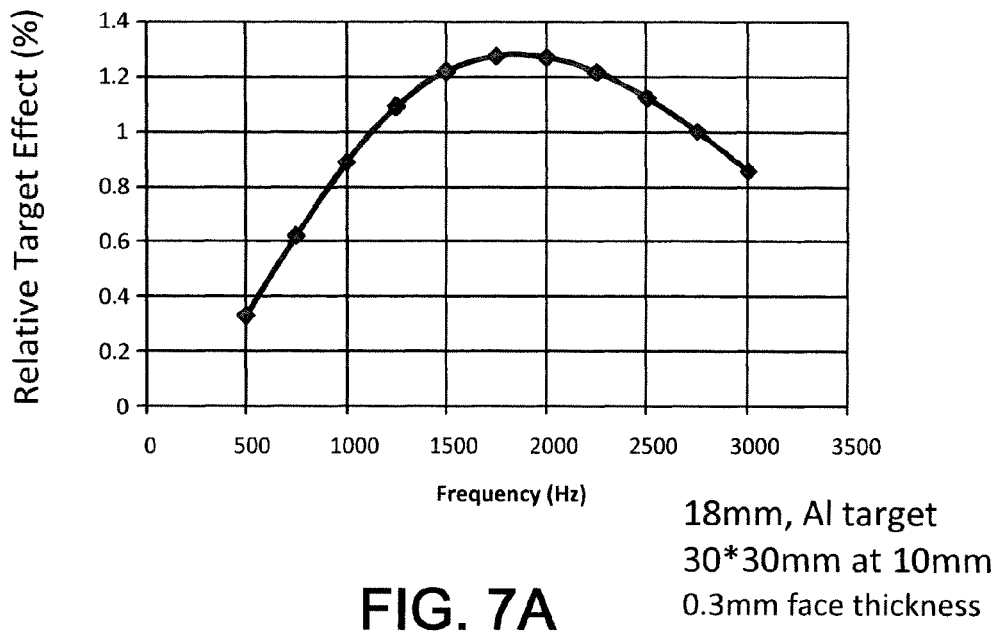
Figure 7B:
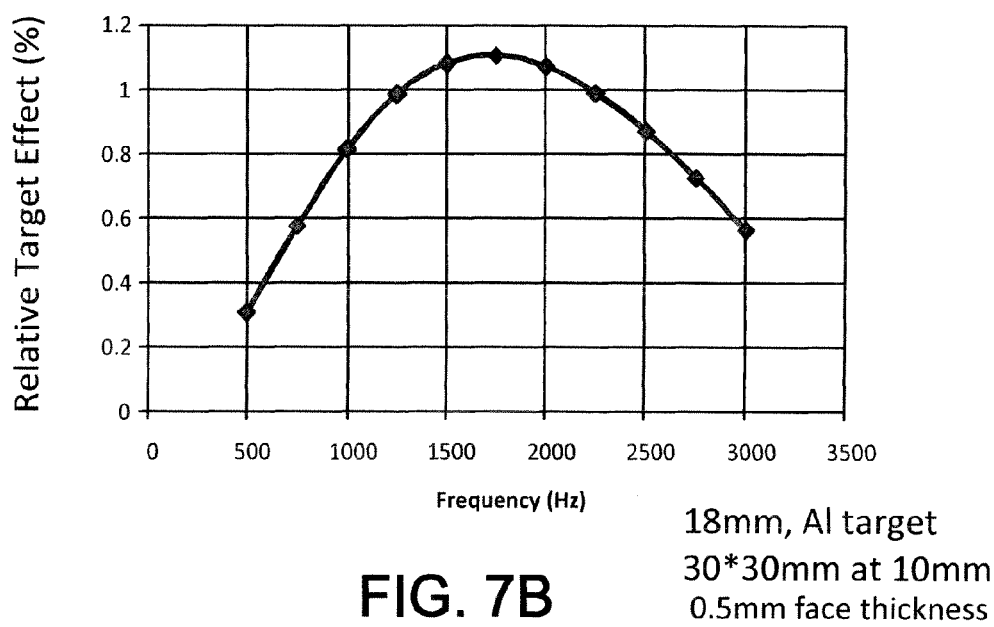

| Frequency (Hz) | Relative target effect (%) |
|---|---|
| FIG. 7A | |
| 500 | 0.329867 |
| 750 | 0.621443 |
| 1000 | 0.88935 |
| 1250 | 1.092336 |
| 1500 | 1.218788 |
| 1750 | 1.274273 |
| 2000 | 1.269149 |
| 2250 | 1.214784 |
| 2500 | 1.122457 |
| 2750 | 1.000432 |
| 3000 | 0.85684 |
| FIG. 7B | |
| 500 | 0.306939 |
| 750 | 0.574394 |
| 1000 | 0.814225 |
| 1250 | 0.986881 |
| 1500 | 1.082344 |
| 1750 | 1.106777 |
| 2000 | 1.071677 |
| 2250 | 0.989037 |
| 2500 | 0.870429 |
| 2750 | 0.725171 |
| 3000 | 0.561399 |
| FIG. 7C | |
| 500 | 0.288295 |
| 750 | 0.536074 |
| 1000 | 0.752596 |
| 1250 | 0.900361 |
| 1500 | 0.970289 |
| 1750 | 0.970075 |
| 2000 | 0.911164 |
| 2250 | 0.807182 |
| 2500 | 0.66984 |
| 3000 | 0.332861 |
| FIG. 7D | |
| 1000 | 0.157809 |
| 2000 | 0.574649 |
| 3000 | 1.122275 |
| 4000 | 1.675689 |
| 5000 | 2.156581 |
| 6000 | 2.532696 |

18 mm diameter Stainless Steel Metal Face

| Frequency (Hz) | Relative target effect (%) |
|---|---|
| 7000 | 2.801826 |
| 8000 | 2.974929 |
| 9000 | 3.0666 |
| 10000 | 3.09168 |
| 11000 | 3.061517 |
| 12000 | 2.987142 |
| 13000 | 2.877883 |
| 14000 | 2.739717 |
| 15000 | 2.580387 |
| 16000 | 2.403 |
| 17000 | 2.2136 |
| FIG. 7E | |
| 1000 | 0.1458 |
| 2000 | 0.517021 |
| 3000 | 0.971474 |
| 4000 | 1.386021 |
| 5000 | 1.698264 |
| 6000 | 1.896185 |
| 7000 | 1.992331 |
| 8000 | 2.007081 |
| 9000 | 1.959749 |
| 10000 | 1.86559 |
| 11000 | 1.738201 |
| 12000 | 1.586482 |
| 13000 | 1.417258 |
| 14000 | 1.23684 |
| 15000 | 1.049521 |
| FIG. 7F | |
| 1000 | 0.135258 |
| 2000 | 0.468176 |
| 3000 | 0.848783 |
| 4000 | 1.16194 |
| 5000 | 1.372292 |
| 6000 | 1.466172 |
| 7000 | 1.471186 |
| 8000 | 1.41115 |
| 9000 | 1.305185 |
| 10000 | 1.167811 |
| 11000 | 1.011328 |
| 12000 | 0.843011 |
| 13000 | 0.6684 |
| 14000 | 0.491392 |
| 15000 | 0.316335 |
| FIG. 7G | |
| 1000 | 0.126184 |
| 2000 | 0.423679 |
| 3000 | 0.797024 |
| 4000 | 1.161868 |
| 5000 | 1.471099 |
| 6000 | 1.710089 |
| 7000 | 1.882884 |
| 8000 | 2.001278 |
| 9000 | 2.077509 |
| 10000 | 2.122011 |
| 11000 | 2.144516 |
| 12000 | 2.149012 |
| 13000 | 2.14242 |
| 14000 | 2.127785 |
| 15000 | 2.106854 |
| 20000 | 1.957069 |
| 25000 | 1.789696 |
| 30000 | 1.629503 |
| 35000 | 1.482323 |
| FIG. 7H | |
| 1000 | 0.141944 |
| 2000 | 0.47343 |
| 3000 | 0.872029 |
| 4000 | 1.238661 |
| 5000 | 1.526441 |
| 6000 | 1.729833 |
| 7000 | 1.860678 |

-continued 18 mm diameter Stainless Steel Metal Face

| Frequency (Hz) | Relative target effect (%) |
|---|---|
| 8000 | 1.936607 |
| 9000 | 1.972849 |
| 10000 | 1.980854 |
| 11000 | 1.971366 |
| 12000 | 1.948451 |
| 13000 | 1.917369 |
| 14000 | 1.879728 |
| 15000 | 1.839048 |
| 20000 | 1.616929 |
| 25000 | 1.400522 |
| 30000 | 1.204903 |

FIG. 7I

| 1000 | 0.149656 |
|---|---|
| 2000 | 0.493486 |
| 3000 | 0.888418 |
| 4000 | 1.229642 |
| 5000 | 1.478171 |
| 6000 | 1.637453 |
| 7000 | 1.726295 |
| 8000 | 1.765366 |
| 9000 | 1.768709 |
| 10000 | 1.751478 |
| 11000 | 1.718716 |
| 12000 | 1.677635 |
| 13000 | 1.630544 |
| 14000 | 1.580302 |
| 15000 | 1.52878 |
| 20000 | 1.27207 |
| 25000 | 1.043162 |
| 30000 | 0.849122 |

30 mm diameter Stainless Steel Metal Face

| Frequency (Hz) | Relative target effect (%) |
|---|---|

FIG. 8A

| 500 | 0.665114 |
|---|---|
| 750 | 1.067104 |
| 1000 | 1.296777 |
| 1250 | 1.356063 |
| 1500 | 1.285303 |
| 1750 | 1.125929 |
| 2000 | 0.910446 |

FIG. 8B

| 500 | 0.632894 |
|---|---|
| 750 | 1.000899 |
| 1000 | 1.188432 |
| 1250 | 1.203981 |
| 1500 | 1.088599 |
| 1750 | 0.888249 |
| 2000 | 0.637428 |

FIG. 8C

| 500 | 0.602059 |
|---|---|
| 750 | 0.938345 |
| 1000 | 1.089035 |
| 1250 | 1.065728 |
| 1500 | 0.915957 |
| 1750 | 0.686237 |
| 2000 | 0.412455 |

FIG. 8D

| 1000 | 0.416784 |
|---|---|
| 2000 | 1.365036 |
| 3000 | 2.358621 |
| 4000 | 3.152685 |

-continued 30 mm diameter Stainless Steel Metal Face

| Frequency (Hz) | Relative target effect (%) |
|---|---|
| 5000 | 3.698341 |
| 6000 | 4.018267 |
| 7000 | 4.152195 |
| 8000 | 4.138438 |
| 9000 | 4.010768 |
| 10000 | 3.79756 |
| 11000 | 3.522637 |
| 12000 | 3.204798 |
| 13000 | 2.858842 |
| 14000 | 2.497065 |
| 15000 | 2.128459 |

FIG. 8E

| 1000 | 0.389831 |
|---|---|
| 2000 | 1.213947 |
| 3000 | 1.965414 |
| 4000 | 2.450697 |
| 5000 | 2.682404 |
| 6000 | 2.71959 |
| 7000 | 2.617814 |
| 8000 | 2.419247 |
| 9000 | 2.155633 |
| 10000 | 1.850537 |
| 11000 | 1.521999 |
| 12000 | 1.183235 |

FIG. 8F

| 1000 | 0.365956 |
|---|---|
| 2000 | 1.086568 |
| 3000 | 1.657561 |
| 4000 | 1.943948 |
| 5000 | 1.997761 |
| 6000 | 1.894252 |
| 7000 | 1.689975 |
| 8000 | 1.423775 |
| 9000 | 1.123287 |
| 10000 | 0.807017 |
| 11000 | 0.488533 |
| 12000 | 0.177872 |

FIG. 8G

| 1000 | 0.284877 |
|---|---|
| 2000 | 0.846997 |
| 3000 | 1.374345 |
| 4000 | 1.750179 |
| 5000 | 1.98462 |
| 6000 | 2.118312 |
| 7000 | 2.18738 |
| 8000 | 2.213602 |
| 9000 | 2.212951 |
| 10000 | 2.194754 |
| 11000 | 2.164965 |
| 12000 | 2.127832 |
| 13000 | 2.085893 |
| 14000 | 2.041308 |
| 15000 | 1.995245 |
| 20000 | 1.763226 |
| 25000 | 1.549951 |
| 30000 | 1.360867 |

FIG. 8H

| 1000 | 0.308904 |
|---|---|
| 2000 | 0.891953 |
| 3000 | 1.389764 |
| 4000 | 1.702343 |
| 5000 | 1.864125 |
| 6000 | 1.931947 |
| 7000 | 1.943797 |
| 8000 | 1.923789 |
| 9000 | 1.885078 |
| 10000 | 1.835897 |
| 11000 | 1.780914 |
| 12000 | 1.722791 |
| 13000 | 1.663461 |
| 14000 | 1.604028 |

30 mm diameter Stainless Steel Metal Face

| Frequency (Hz) | Relative target effect (%) |
| --- | --- |
| 15000 | 1.545282 |
| 20000 | 1.270519 |
| 25000 | 1.036248 |
| 30000 | 0.840883 |

FIG. 8I

| | |
| --- | --- |
| 1000 | 0.327378 |
| 2000 | 0.919458 |
| 3000 | 1.383365 |
| 4000 | 1.640115 |
| 5000 | 1.749072 |
| 6000 | 1.772206 |
| 7000 | 1.748732 |
| 8000 | 1.700525 |
| 9000 | 1.639423 |
| 10000 | 1.571971 |
| 11000 | 1.501705 |
| 12000 | 1.431133 |
| 13000 | 1.361393 |
| 14000 | 1.292675 |
| 15000 | 1.227273 |
| 20000 | 0.933673 |
| 25000 | 0.702735 |
| 30000 | 0.52547 |

In the illustrated embodiments of FIGS. 5D-5F, the sensor 2 includes a circular stainless steel metal face 6 having a diameter of about 8 mm (e.g., +/−10%) and a thickness of about 0.2 to 1.0 mm (e.g., +/−10%) for sensing stainless steel targets 100 in which the frequency value is preferably about 15,860 Hz to about 66,174 Hz. FIG. 5D shows the case for a face thickness 6a of about 0.2 mm (e.g., +/−10%), in which the frequency value is preferably about 26,262 Hz to about 66,174 Hz. As shown in FIG. 5E for a 0.4 mm face thickness, the preferred operating frequency is in a range from about 19,179 Hz to about 46,261 Hz. FIG. 5F illustrates the case where the sensing face thickness is about 0.6 mm and the preferred operating frequency is in a range from about 15,860 Hz to about 42,851 Hz, where the preferred frequency ranges include values for which the relative target effect is at or above about 80% of the local maximum.

FIGS. 5G-5I illustrate curves for sensor designs with a circular stainless steel metallic sensing face with a thickness of about 0.2 to about 1.0 mm and an 8 mm diameter for sensing steel targets, where the frequency value is about 20,156 Hz or more and about 73,355 Hz or less. As shown in FIG. 5G for a 0.2 mm face thickness, the preferred operating frequency is in a range from about 24,321 Hz to about 72,159 Hz. FIG. 5H illustrates the case for a sensing face thickness 0.4 mm with the frequency value is preferably in a range of about 23,229 Hz to about 91,092 Hz. FIG. 5I illustrates the case for a sensing face thickness 0.6 mm with the frequency value is preferably in a range of about 20,156 Hz to about 73,355 Hz.

FIGS. 6A-6I depict relative target effect vs. frequency curves for sensors having 12 mm diameter stainless steel sensing faces. FIGS. 6A-6C provide curves for sensor designs with a circular stainless steel metallic sensing face with a thickness of about 0.3 to about 1.0 mm for sensing aluminum targets, where the frequency value is preferably about 1,839 to about 4,748 Hz. In the example of FIG. 6A, the sensing face thickness is about 0.3 mm, and the frequency value is preferably in a range from about 2,205 to about 4,748 Hz. FIG. 6B illustrates the case for a sensing face thickness of about 0.5 mm, wherein the preferred frequency range is from about 1,939 Hz to about 4,227 Hz, and FIG. 6C shows the case for a sensing face thickness of about 0.7 mm for which the preferred frequency is about 1,839 to about 3,910 Hz.

FIGS. 6D-6F provide curves for sensor designs with 12 mm diameter sensing face with a thickness of about 0.3 to about 1.0 mm for sensing stainless steel targets, where the frequency value is preferably about 6,514 to about 19,896 Hz. FIG. 6D shows the case for a 0.3 mm face thickness, where the preferred frequency range is from about 5,083 Hz to about 13,439 Hz, FIG. 6E illustrates the case for a face thickness of about 0.5 mm, where the preferred frequency range is from about 7,724 Hz to about 19,896 Hz, and FIG. 6F shows the curve for a 0.7 mm face thickness, in which the preferred frequency range is from about 6,514 Hz to about 19,599 Hz.

FIGS. 6G-6I illustrate the 12 mm diameter examples for sensing steel targets using a stainless steel sensing face thickness of about 0.3 to about 1.0 mm, where the frequency value is preferably in a range from about 7,616 Hz to about 52,846 Hz. FIG. 6G shows the case for a 0.3 mm face thickness, where the preferred frequency range is from about 10,814 to about 52,846 Hz, FIG. 6H illustrates a curve for the case of a 0.5 mm sensing face thickness in which the preferred frequency range is from about 8,778 Hz to about 37,024 Hz, and FIG. 6I depicts a curve for a 0.7 mm face thickness, in which the preferred frequency range is from about 7,616 Hz to about 29,300 Hz.

FIGS. 7A-7I illustrate relative target effect vs. frequency curves for sensors having 18 mm diameter stainless steel sensing faces. FIGS. 7A-7C show examples for sensing aluminum targets using a stainless steel sensing face thickness of about 0.3 to about 1.0 mm, where the frequency value is preferably in a range from about 1,039 Hz to about 2,711 Hz. As shown in the curve of FIG. 7A for a 0.3 mm sensing face thickness, the preferred frequency range is from about 1,160 to about 2,711 Hz. FIG. 7B illustrates a curve for the case of a 0.5 mm sensing face thickness in which the preferred frequency range is from about 1,103 Hz to about 2,468 Hz, and FIG. 7C shows a curve for a 0.7 mm face thickness in which the preferred frequency range is from about 1,039 Hz to about 2,306 Hz.

FIGS. 7D-7F provide curves for sensor designs with 18 mm diameter sensing face with a thickness of about 0.3 to about 1.0 mm for sensing stainless steel targets, where the frequency value is preferably about 4,071 to about 15,603 Hz. FIG. 7D shows the case for a 0.3 mm face thickness, where the preferred frequency range is from about 5,842 Hz to about 15,603 Hz, FIG. 7E illustrates the case for a face thickness of about 0.5 mm, where the preferred frequency range is from about 4,703 Hz to about 11,874 Hz, and FIG. 7F shows the curve for a 0.7 mm face thickness, in which the preferred frequency range is from about 4,071 Hz to about 9,942 Hz.

Figure 7I:
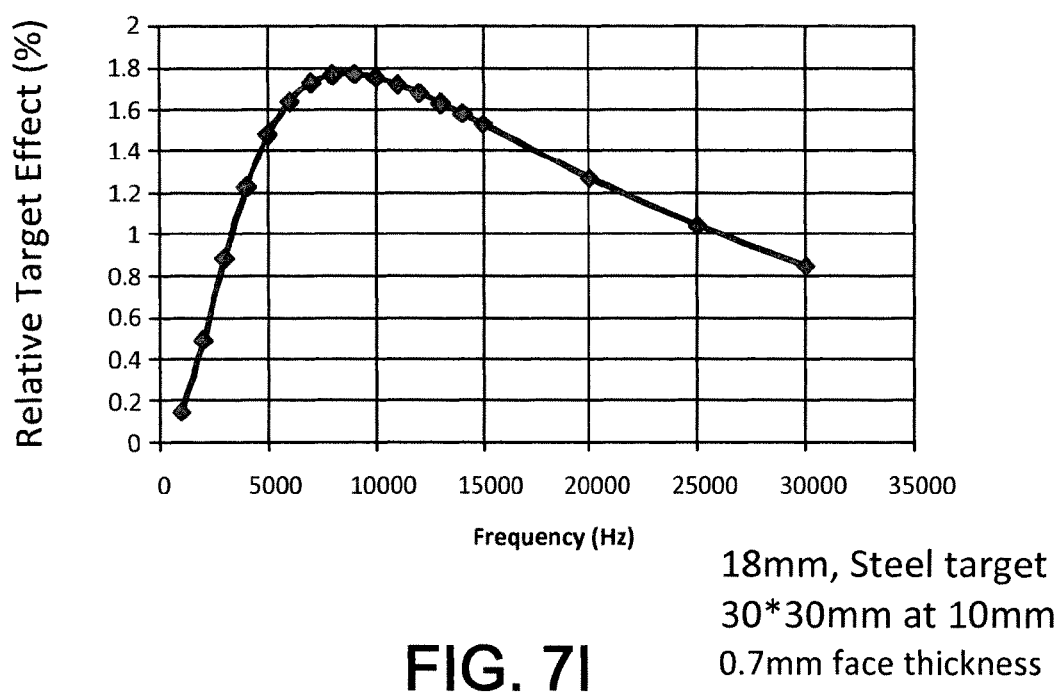

FIGS. 7G-7I provide curves for sensor designs with 18 mm diameter sensing face with a thickness of about 0.3 to about 1.0 mm for sensing steel targets, where the frequency value is preferably about 4,746 to about 17,217 Hz. FIG. 7G shows the case for a 0.3 mm face thickness, where the preferred frequency range is from about 6,053 Hz to about 27,200 Hz, FIG. 7H illustrates the case for a face thickness of about 0.5 mm, where the preferred frequency range is from about 5,286 Hz to about 20,745 Hz, and FIG. 7I shows the curve for a 0.7 mm face thickness, in which the preferred frequency range is from about 4,746 Hz to about 17,217 Hz.

Figure 8C:
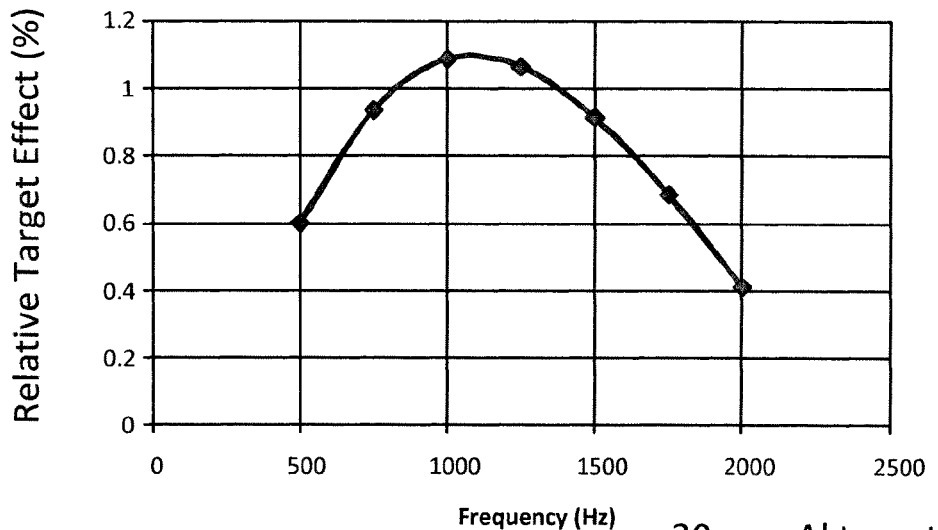

Referring now to FIGS. 8A-8I, exemplary relative target effect vs. frequency curves are illustrated for sensors having 30 mm diameter stainless steel sensing faces. FIGS. 8A-8C provide examples for sensing aluminum targets using a stainless steel sensing face thickness of about 0.3 to about 1.0 mm, where the frequency value is preferably in a range from about 700 Hz to about 1,798 Hz. FIG. 8A shows the case of a 0.3 mm thick sensing face in which the preferred frequency range is from about 770 to about 1,798 Hz. FIG. 8B illustrates a curve for the case of a 0.5 mm sensing face thickness in which the preferred frequency range is from about 724 Hz to about 1,656 Hz, and FIG. 8C shows a curve for a 0.7 mm face thickness in which the preferred frequency range is from about 700 Hz to about 1,549 Hz.

Figure 8D:
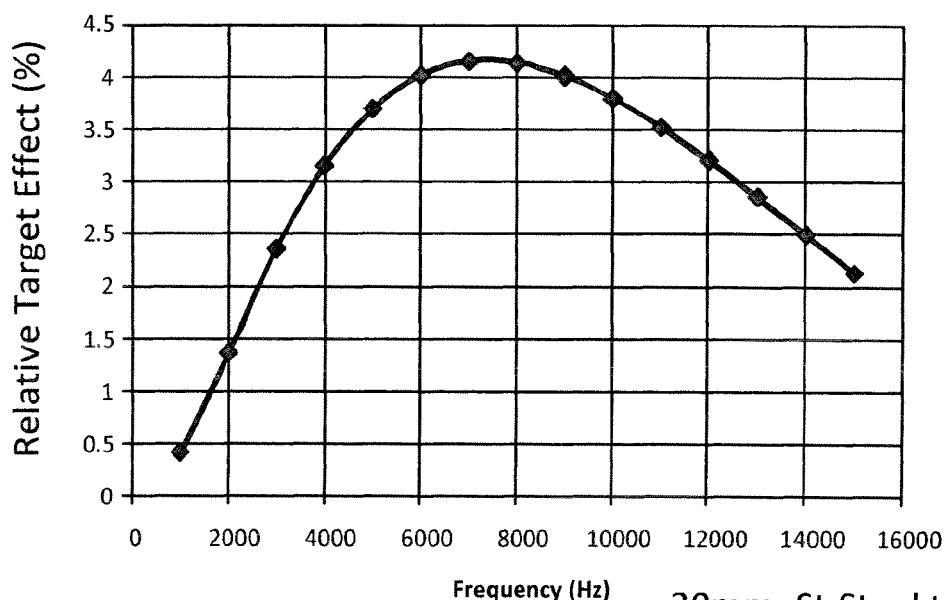

In the examples of FIGS. 8D-8F, curves are illustrated for sensor designs having a thickness of about 0.3 to about 1.0 mm for sensing stainless steel targets, where the frequency value is preferably about 2,896 to about 11,632 Hz. FIG. 8D shows the case for a 0.3 mm face thickness, where the preferred frequency range is from about 4,310 Hz to about 11,632 Hz, FIG. 8E illustrates the case for a face thickness of about 0.5 mm, where the preferred frequency range is from about 3,433 Hz to about 8,924 Hz, and FIG. 8F shows the curve for a 0.7 mm face thickness, in which the preferred frequency range is from about 2,896 Hz to about 7,345 Hz.

Figure 8G:
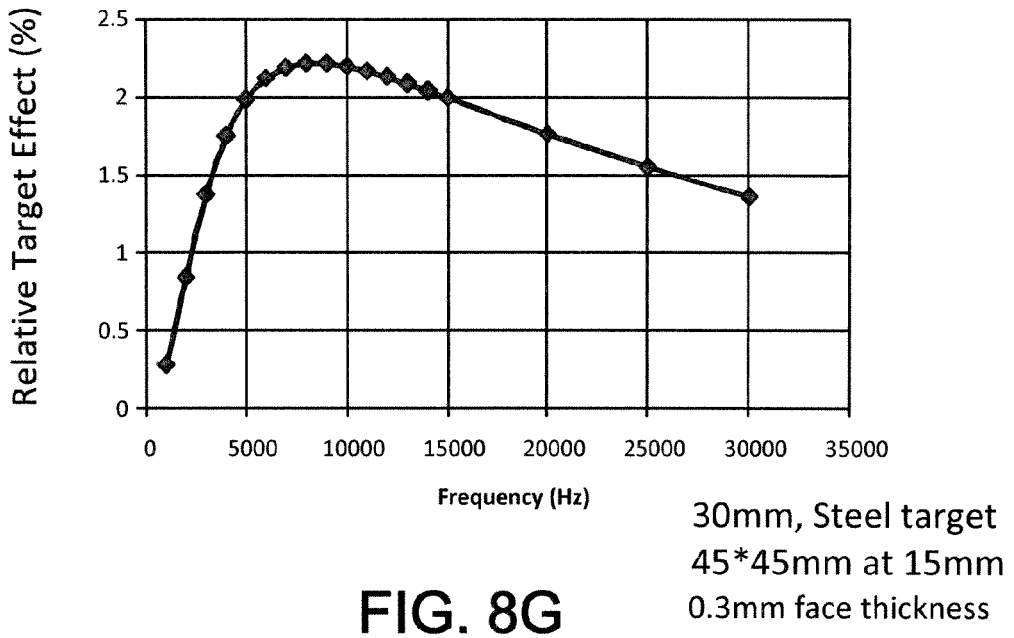
Figure 8H:
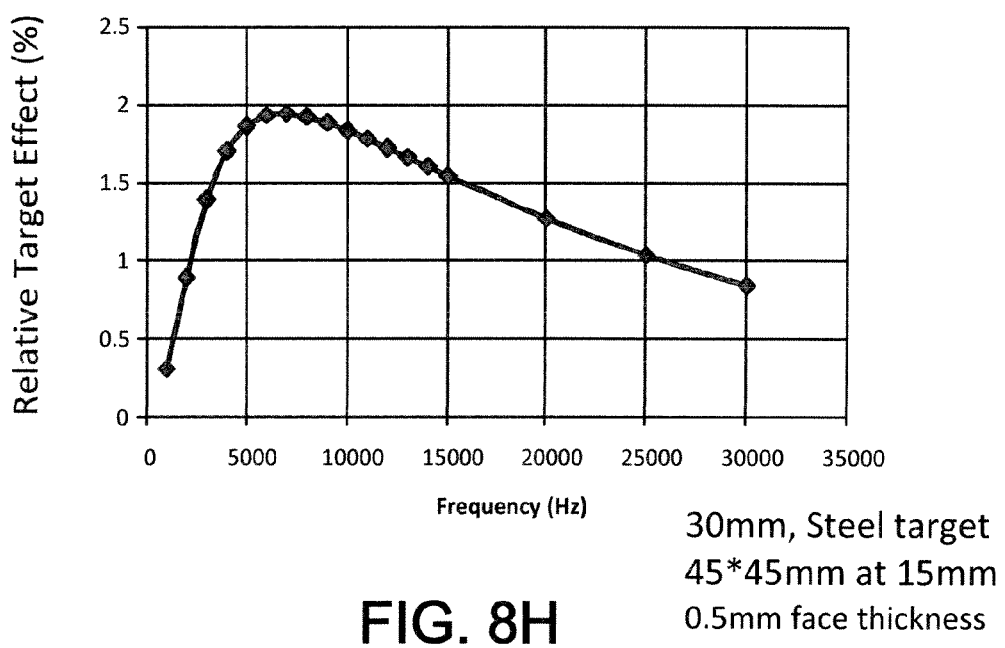
Figure 8I:
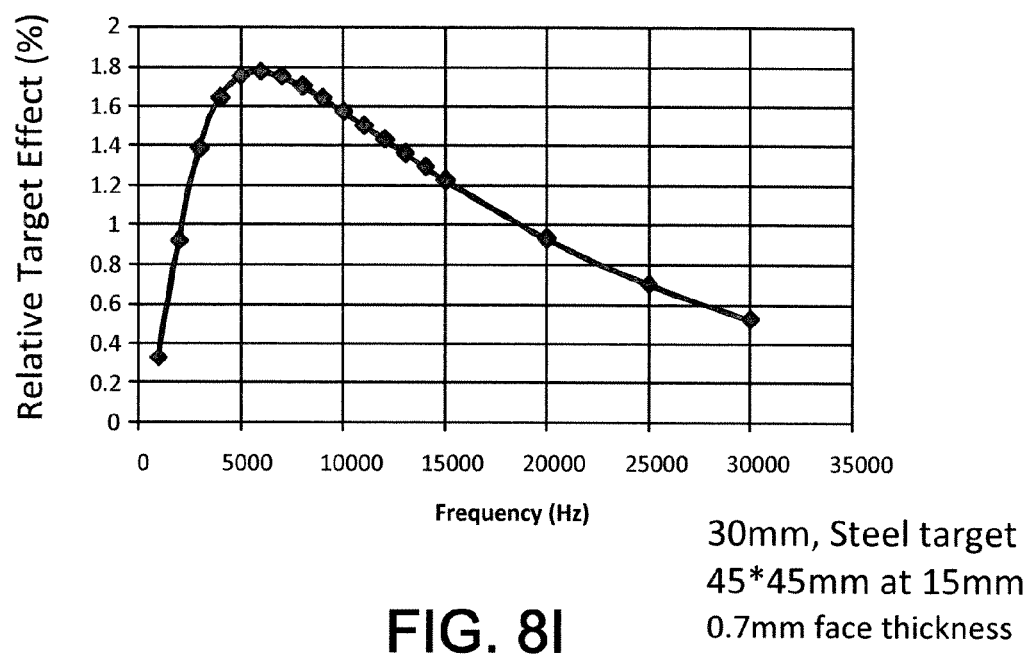

FIGS. 8G-8I show curves for sensor designs with 30 mm diameter sensing face with a thickness of about 0.3 to about 1.0 mm for sensing steel targets, where the frequency value is preferably about 3,134 to about 19,835 Hz. FIG. 8G shows the case for a 0.3 mm face thickness, where the preferred frequency range is from about 4,088 Hz to about 19,835 Hz, FIG. 8H illustrates the case for a face thickness of about 0.5 mm, where the preferred frequency range is from about 3,529 Hz to about 14,834 Hz, and FIG. 8I shows the curve for a 0.7 mm face thickness, in which the preferred frequency range is from about 3,134 Hz to about 12,925 Hz.

Further aspects of the disclosure provide a method for sensing the presence or absence of a target object 100 in a target sensing area 7. The method comprises providing an inductive proximity sensor 2 having a body with a housing 4 and a sensing face 6 formed of a metallic material of a given thickness 6a extending across a sensing surface facing the target sensing area 7, and a coil 14. The method further includes providing alternating current to the coil to generate an alternating magnetic field 18 extending outward from the sensing face 6 in the target sensing area 7 at a frequency in a frequency range that includes a frequency value that maximizes a relative target effect for the sensing face area, material, and thickness, and a target material from which the target object 100 is made. In addition, the method comprises sensing an impedance of the coil 14, and providing a signal indicative of the presence or absence of objects 100 in the target sensing area 7 based at least partially on the sensed impedance.

The above implementations are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

Having thus described the invention, the following is claimed:

1. An inductive proximity sensor for sensing the presence or absence of a target object in a target sensing area, the sensor comprising:
   a body with a housing and a sensing face extending across a sensing surface facing a target sensing area, the sensing face formed of a metallic material of a given thickness;
   a coil system with only one coil and a capacitance coupled in parallel with one another to form a parallel resonant tank circuit providing alternating current to generate an alternating magnetic field extending outward from the sensing face in the target sensing area at a fixed frequency in a frequency range that includes a frequency value that maximizes a relative target effect for the sensing face area, material, and thickness, and a target material from which the target object is made, the alternating magnetic field inducing eddy currents in conductive materials including the target object proximate the one coil, and the relative target effect reflecting a ratio of losses in the target object to losses in the sensor; and
   a sensing system operative to sense an impedance of the one coil and to provide one signal reflecting a coil impedance change indicative of the presence or absence of objects in the target sensing area based at least partially on the sensed impedance.

2. The sensor of claim 1, wherein the alternating current is provided to the one coil at a frequency value in a range for which the relative target effect is within about 20 percent of a global or relative maximum.

3. The sensor of claim 1, wherein the sensing face is formed of a stainless steel metallic material of a thickness of about 0.2 mm or more and about 1.0 mm or less, wherein the sensing face is circular with a diameter of about 8 mm, wherein the target material is aluminum, and wherein the frequency value is about 3,443 Hz or more and about 9,919 Hz or less.

4. The sensor of claim 1, wherein the sensing face is formed of a stainless steel metallic material of a thickness of about 0.2 mm or more and about 1.0 mm or less, wherein the sensing face is circular with a diameter of about 8 mm, wherein the target material is stainless steel, and wherein the frequency value is about 15,860 Hz or more and about 66,174 Hz or less.

5. The sensor of claim 1, wherein the sensing face is formed of a stainless steel metallic material of a thickness of about 0.2 mm or more and about 1.0 mm or less, wherein the sensing face is circular with a diameter of about 8 mm, wherein the target material is steel, and wherein the frequency value is about 20,156 Hz or more and about 73,355 Hz or less.

6. The sensor of claim 1, wherein the sensing face is formed of a stainless steel metallic material of a thickness of about 0.3 mm or more and about 1.0 mm or less, wherein the sensing face is circular with a diameter of about 12 mm, wherein the target material is aluminum, and wherein the frequency value is about 1,839 Hz or more and about 4748 Hz or less.

7. The sensor of claim 1, wherein the sensing face is formed of a stainless steel metallic material of a thickness of about 0.3 mm or more and about 1.0 mm or less, wherein the sensing face is circular with a diameter of about 12 mm, wherein the target material is stainless steel, and wherein the frequency value is about 6,514 Hz or more and about 19,896 Hz or less.

8. The sensor of claim 1, wherein the sensing face is formed of a stainless steel metallic material of a thickness of about 0.3 mm or more and about 1.0 mm or less, wherein the sensing face is circular with a diameter of about 12 mm, wherein the target material is steel, and wherein the frequency value is about 7,616 Hz or more and about 52,846 Hz or less.

9. The sensor of claim 1, wherein the sensing face is formed of a stainless steel metallic material of a thickness of about 0.3 mm or more and about 1.0 mm or less, wherein the sensing face is circular with a diameter of about 18 mm, wherein the target material is aluminum, and wherein the frequency value is about 1,039 Hz or more and about 2,711 Hz or less.

10. The sensor of claim 1, wherein the sensing face is formed of a stainless steel metallic material of a thickness of about 0.3 mm or more and about 1.0 mm or less, wherein the sensing face is circular with a diameter of about 18 mm, wherein the target material is stainless steel, and wherein the frequency value is about 4,071 Hz or more and about 15,603 Hz or less.

11. The sensor of claim 1, wherein the sensing face is formed of a stainless steel metallic material of a thickness of about 0.3 mm or more and about 1.0 mm or less, wherein the sensing face is circular with a diameter of about 18 mm, wherein the target material is steel, and wherein the frequency value is about 4,746 Hz or more and about 17,217 Hz or less.

12. The sensor of claim 1, wherein the sensing face is formed of a stainless steel metallic material of a thickness of about 0.3 mm or more and about 1.0 mm or less, wherein the sensing face is circular with a diameter of about 30 mm, wherein the target material is aluminum, and wherein the frequency value is about 700 Hz or more and about 1,798 Hz or less.

13. The sensor of claim 1, wherein the sensing face is formed of a stainless steel metallic material of a thickness of about 0.3 mm or more and about 1.0 mm or less, wherein the sensing face is circular with a diameter of about 30 mm, wherein the target material is stainless steel, and wherein the frequency value is about 2,896 Hz or more and about 11,632 Hz or less.

14. The sensor of claim 1, wherein the sensing face is formed of a stainless steel metallic material of a thickness of about 0.3 mm or more and about 1.0 mm or less, wherein the sensing face is circular with a diameter of about 30 mm, wherein the target material is steel, and wherein the frequency value is about 3,134 Hz or more and about 19,835 Hz or less.

15. A method for sensing the presence or absence of a target object in a target sensing area, the method comprising:
providing an inductive proximity sensor having a body with a housing and a sensing face formed of a metallic material of a given thickness extending across a sensing surface facing the target sensing area, and a coil system having only one coil and a capacitance coupled in parallel with one another to form a parallel resonant tank circuit;
using the resonant tank circuit, providing alternating current to cause the one coil to generate an alternating magnetic field extending outward from the sensing face in the target sensing area at a fixed frequency in a frequency range that includes a frequency value that maximizes a relative target effect for the sensing face area, material, and thickness, and a target material from which the target object is made, the alternating magnetic field inducing eddy currents in conductive materials including the target object proximate the one coil, and the relative target effect reflecting a ratio of losses in the target object to losses in the sensor;
sensing an impedance of the one coil; and
providing one signal reflecting a coil impedance change indicative of the presence or absence of objects in the target sensing area based at least partially on the sensed impedance.

16. The method of claim 15, wherein the alternating current is provided to the one coil at a frequency value in a range for which the relative target effect is within about 20 percent of the global or relative maximum.

17. The sensor of claim 2, wherein the resonant tank circuit provides sinusoidal alternating current to generate the alternating magnetic field.

18. The sensor of claim 17, wherein the frequency value that maximizes the relative target effect is selected to maximize a ratio of target energy loss to sensor energy loss.

19. The sensor of claim 1, wherein the resonant tank circuit provides sinusoidal alternating current to generate the alternating magnetic field.

20. The sensor of claim 1, wherein the frequency value that maximizes the relative target effect is selected to maximize a ratio of target energy loss to sensor energy loss.

* * * * *